United States Patent
Steckel et al.

(10) Patent No.: US 10,685,940 B2
(45) Date of Patent: Jun. 16, 2020

(54) LIGHT EMITTING STRUCTURE TO AID LED LIGHT EXTRACTION

(71) Applicant: Apple Inc., Cupertino, CA (US)

(72) Inventors: Jonathan S. Steckel, Cupertino, CA (US); Jean-Jacques P. Drolet, San Jose, CA (US); Roland Van Gelder, Cupertino, CA (US); Kelly C. McGroddy, San Francisco, CA (US); Ion Bita, Santa Clara, CA (US); James Michael Perkins, Mountain View, CA (US); Andreas Bibl, Los Altos, CA (US); Sajjad A. Khan, Santa Clara, CA (US); James E. Pedder, Cupertino, CA (US); Elmar Gehlen, Cupertino, CA (US)

( * ) Notice: Subject to any disclaimer, the term of this patent is extended or adjusted under 35 U.S.C. 154(b) by 0 days.

(21) Appl. No.: 16/375,614

(22) Filed: Apr. 4, 2019

(65) Prior Publication Data
US 2019/0237444 A1    Aug. 1, 2019

Related U.S. Application Data

(63) Continuation of application No. 15/740,739, filed as application No. PCT/US2016/041005 on Jul. 5, 2016, now Pat. No. 10,297,581.
(Continued)

(51) Int. Cl.
*H01L 29/18*    (2006.01)
*H01L 33/00*    (2010.01)
(Continued)

(52) U.S. Cl.
CPC .... *H01L 25/0753* (2013.01); *G02F 1/133603* (2013.01); *H01L 33/60* (2013.01);
(Continued)

(58) Field of Classification Search
USPC ............... 257/81, 82, 91, 98–100, 116–117, 257/432–437, 749, E33.056–E33.059,
(Continued)

(56) References Cited

U.S. PATENT DOCUMENTS 9,484,504 B2    11/2016  Bibl et al.
9,728,687 B2 *   8/2017  Stott .................... H01L 33/507
(Continued)

FOREIGN PATENT DOCUMENTS

EP    2395569 A2    12/2011
EP    3168884 A1    5/2017
(Continued)

OTHER PUBLICATIONS

PCT International Search Report and Written Opinion for International Application No. PCT/US2016/041005, dated Jan. 2, 2017, 18 pages.
(Continued)

*Primary Examiner* — Niki H Nguyen
(74) *Attorney, Agent, or Firm* — Jaffery Watson Mendonsa & Hamilton LLP

(57) ABSTRACT

Display panels and methods of manufacture are described for down converting a peak emission wavelength of a pump LED within a subpixel with a quantum dot layer. In some embodiments, pump LEDs with a peak emission wavelength below 500 nm, such as between 340 nm and 420 nm are used. QD layers in accordance with embodiments can be integrated into a variety of display panel structures including a wavelength conversion cover arrangement, QD patch arrangement, or QD layers patterned on the display substrate.

20 Claims, 21 Drawing Sheets

Related U.S. Application Data

(60) Provisional application No. 62/189,601, filed on Jul. 7, 2015.

(51) Int. Cl.
   *H01L 25/075*     (2006.01)
   *G02F 1/13357*    (2006.01)
   *H01L 33/60*      (2010.01)
   *H01L 33/44*      (2010.01)

(52) U.S. Cl.
   CPC .......... *G02F 2001/133614* (2013.01); *G02F 2202/108* (2013.01); *H01L 33/44* (2013.01)

(58) Field of Classification Search
   USPC ....... 257/E25.032; 438/25–28, 455, 47, 478, 438/443
   See application file for complete search history.

(56) References Cited

U.S. PATENT DOCUMENTS

| | | |
|---|---|---|
| 2006/0145137 A1 | 7/2006 | Wang et al. |
| 2010/0019260 A1 | 1/2010 | Epler et al. |
| 2010/0084629 A1* | 4/2010 | Park .................. B82Y 20/00 257/13 |
| 2010/0123155 A1* | 5/2010 | Pickett .................. B82Y 15/00 257/98 |
| 2013/0070480 A1* | 3/2013 | Griffin ................ G02B 6/0028 362/612 |
| 2013/0146841 A1* | 6/2013 | Yun .................... H01L 33/04 257/13 |
| 2013/0334559 A1* | 12/2013 | Vdovin ................ H01L 33/54 257/98 |
| 2014/0133177 A1* | 5/2014 | Miller .................. G02B 6/005 362/607 |
| 2014/0264412 A1* | 9/2014 | Yoon ................... H01L 33/504 257/98 |
| 2014/0339495 A1* | 11/2014 | Bibl .................... H01L 33/504 257/13 |
| 2014/0367633 A1 | 12/2014 | Bibl et al. |
| 2015/0111329 A1 | 4/2015 | Wu et al. |
| 2015/0169011 A1 | 6/2015 | Bibl et al. |
| 2015/0187987 A1 | 7/2015 | Sim et al. |
| 2015/0187991 A1 | 7/2015 | McGroddy et al. |
| 2015/0219936 A1* | 8/2015 | Kim ................. G02F 1/133602 362/97.1 |
| 2016/0197232 A1 | 7/2016 | Bour et al. |
| 2017/0162553 A1 | 6/2017 | Bibl et al. |
| 2017/0062674 A1 | 10/2017 | Kwon et al. |
| 2017/0294416 A1 | 10/2017 | Wu et al. |
| 2017/0294565 A1 | 10/2017 | Kim |
| 2017/0301660 A1 | 10/2017 | Pokhriyal et al. |
| 2018/0190625 A1 | 7/2018 | Steckel et al. |

FOREIGN PATENT DOCUMENTS

| | | |
|---|---|---|
| WO | 2016/196390 A1 | 12/2016 |
| WO | 2016/200635 A1 | 12/2016 |
| WO | 2019147589 | 8/2019 |

OTHER PUBLICATIONS

PCT/US2019/014595, "Notification of Transmittal of the International Search Report and the Written Opinion of the International Searching Authority, or the Declaration" dated Apr. 29, 2019, 15 pages.

\* cited by examiner

LIGHT EMITTING STRUCTURE TO AID LED LIGHT EXTRACTION

RELATED APPLICATIONS

This patent application is a continuation of co-pending U.S. patent application Ser. No. 15/740,739 filed Dec. 28, 2017, which is a U.S. National Phase Application under 35 U.S.C. § 371 of International Application No. PCT/US2016/041005, filed Jul. 5, 2016, entitled LED DISPLAY PANEL WITH INTEGRATED QUANTUM DOTS, which claims the benefit of priority of U.S. Provisional Application No. 62/189,601 filed Jul. 7, 2015, of which PCT/US2016/041005 and U.S. Provisional Application No. 62/189,601 are incorporated herein by reference.

BACKGROUND

Field

Embodiments described herein relate to a display system, and more specifically to the integration of quantum dots into the display area of a display panel.

Background Information

Light emitting diodes (LED) are now commonly found in a variety of lighting systems. LED lighting can be more efficient, durable, versatile, and longer lasting than conventional incandescent and fluorescent lighting systems. For example, LEDs can be designed from a variety of organic and inorganic semiconductor materials to achieve specific emission colors. In order to achieve a white light, different color LEDs can be mixed or covered with a phosphor material to convert the color of light.

One type of commonly employed phosphor material is a particle that exhibits luminescence due to its composition, such as a cerium doped yttrium aluminum garnet (YAG:Ce). Another phosphor material is a quantum dot. Quantum dots are semiconductor materials where the size of the structure is small enough that the electrical and optical characteristics differ from the bulk properties due to quantum confinement effects. Due to the small size, such as 1 to 100 nm, or more typically 1 to 20 nm, quantum dots display unique optical properties that are different from those of the corresponding bulk material, and can be tuned to emit light throughout the visible and infrared spectrum. The wavelength, and hence color, of the photo emission is strongly dependent on the size of a quantum dot. For an exemplary cadmium selenide (CdSe) quantum dot, light emission can be gradually tuned from red for a 5 nm diameter quantum dot, to the violet region for a 1.5 nm quantum dot. One proposed implementation for quantum dots is integration into the backlighting of a liquid crystal display (LCD) panel.

SUMMARY

Display systems and display panels with integrated quantum dot layers are described. In an embodiment, a display panel includes a plurality of LEDs mounted on a display substrate and arranged in a pixel of a pixel array. A first LED is arranged in a first subpixel designed to emit a first peak emission wavelength (e.g. in the red spectrum). A second LED is arranged in a second subpixel designed to emit a second peak emission wavelength (e.g. in the green spectrum). A third LED is arranged in a third subpixel designed to emit a third peak emission wavelength (e.g. in the blue spectrum). Thus, the first, second, and third peak emission wavelengths may be different.

A quantum dot (QD) layer can be aligned over any of the LEDs to emit any of the first, second, or third peak emission wavelengths. Such arrangements may allow for the integration of QD layers over efficient pump LEDs in which a pump LED peak emission wavelength is converted by the QD layer to the subpixel emission wavelength.

In an embodiment, a QD layer is aligned over the first LED, and the QD layer includes QDs designed to emit the first peak emission wavelength. In accordance with embodiments, the first LED (e.g. pump LED) has a peak emission wavelength that is shorter than the first absorption peak in the QD absorption spectrum (e.g. band edge). For example, this may be any wavelength below 500 nm. In an embodiment, the first LED has a peak emission wavelength between 380 nm and 420 nm, and the QD layer includes QDs designed to emit the first peak emission wavelength (e.g. in the red spectrum). In an embodiment, the QD layer is aligned over both the first LED and the second LED, and the second peak emission wavelength is within a green color spectrum.

The QD layers may include QDs arranged in a variety of form factors including dispersed or embedded in matrix materials (e.g. glass, sol-gel, polymer, cross-linked materials), as particles in neat films, within beads, etc. Additionally, various volume loadings (packing density) can be achieved, such as greater than 20% by volume, or more specifically greater than 40% by volume. In some embodiments, QD layer thicknesses of 1-100 μm and packing densities of 1-60% may be utilized. Thus, the QDs can be more widely dispersed, or formed in close packed films with high volume density. In some embodiments, thickness of the QD layers can be reduced to less than 20 μm, or even less than 5 μm by controlling various parameters such as pump LED peak emission wavelength, QD volume loading, QD emission re-absorption, pump LED filters, scattering agents, mirror layers, etc. A reduced QD layer thickness may facilitate incorporation into high resolution displays, e.g. with high pixels per inch (PPI). In an embodiment, QDs within the QD layer are embedded in a cross-linked matrix of ligands bound to the QDs.

A variety of different layers may optionally be located above or below the QD layer, for example, to decrease bleeding of pump LED light, or increase efficiency of the QD layer. In some embodiments, a Bragg reflector layer may be located between the first LED and the QD layer. In such a configuration, the Bragg reflector layer is transparent to the peak emission wavelength of the first LED and reflective to the first peak emission wavelength of the QDs. In some embodiments, a Bragg reflector layers is located over the QD layer. In such a configuration, the Bragg reflector layer is transparent to the first peak emission wavelength of the QDs and reflective of the peak emission wavelength of the first LED. In some embodiments, a color filter layer is located over the QD layer to absorb the peak emission wavelength of the first LED.

QD layers in accordance with embodiments can be integrated into a variety of display panel structures including a wavelength conversion cover arrangement, QD patch arrangement, or QD layers patterned on the display substrate.

In an embodiment, the display panel includes a wavelength conversion cover over the first LED, the second LED, and the third LED mounted on the display substrate, where the wavelength conversion cover includes the QD layer embedded in a cover film. The wavelength conversion cover may additionally include a second QD layer embedded in the cover film and aligned over the second LED, with the second QD layer including QDs designed to emit at the second peak emission wavelength (e.g. the green spectrum). In an embodiment, the wavelength conversion cover does not include a QD layer aligned over the third LED (e.g. with a peak emission wavelength in the blue spectrum). Although, the wavelength conversion cover may include QD layers aligned over all three of the LEDs within the pixel.

In an embodiment, the QD layer is within a QD patch, which includes a planar to surface. The QD patch may include several layers. For example, the QD patch may include a color filter layer over the QD layer to absorb the peak emission wavelength of the first LED. The QD patch may include a Bragg reflector layer under the QD layer. The Bragg reflector layer may be transparent to the peak emission wavelength of the first LED and reflective of the first peak emission wavelength of the QDs in the QD layer. In an embodiment, the QD patch includes a Bragg reflector layer over the QD layer, and the Bragg reflector layer is transparent to the first peak emission wavelength of the QDs in the QD layer and reflective of the peak emission wavelength of the first LED. In an embodiment, a second QD patch is aligned over the second LED, with the second QD patch including a planar top surface and second QDs design to emit the second peak emission wavelength (e.g. the green spectrum). In an embodiment, a QD patch is not aligned over the third LED (e.g. with a peak emission wavelength in the blue spectrum). Although, QD patches may be aligned over all three of the LEDs within the pixel.

In an embodiment, a planarization layer is formed over the display substrate, the planarization layer includes an opening aligned over the first LED, and the QD layer is within the opening aligned over the first LED. In one implementation, a top surface of the QD layer is level with a top surface of the planarization layer. In an embodiment, a second opening is in the planarization layer and aligned over the second LED. A second QD layer may be within the second opening, with the second QD layer including second QDs designed to emit the second peak emission wavelength (e.g. the green spectrum). In an embodiment, a QD layer is not aligned over the third LED (e.g. with a peak emission wavelength in the blue spectrum). Although, QD layers may be aligned over all three of the LEDs within the pixel. In an embodiment, a Bragg reflector layers is located over one or more of the QD layers. In such a configuration, the Bragg reflector layer is transparent to the peak emission wavelength of the QDs (in the one or more QD layers) and reflective of the peak emission wavelength of the first LED.

In an embodiment, a display panel includes a display substrate, an array of LEDs mounted on the display substrate in an array of pixels, and a wavelength conversion cover over the array of pixels. The wavelength conversion cover includes an array of QD layers embedded in a cover film, with the array of QD layers aligned over the array of LEDs. The cover film may include an array of cavities formed in a bottom surface of the cover film, with the array of QD layers contained (e.g. embedded) within the array of cavities. A color filter layer may be formed within the array of cavities to absorb a peak emission wavelength of the array of LEDs. In an embodiment, the array of LEDs (e.g. pump LEDs) may be designed to emit a peak emission wavelength between 380 nm and 420 nm. Although pump LEDs may be design to emit alternative peak emission wavelengths in accordance with embodiments.

The display panel may further include a second array of LEDs mounted on the display substrate in the array of pixels, with the second array of LEDs designed to emit a peak emission wavelength above 438 nm (e.g. in the red, green, or blue spectrums). In an embodiment, the second array of LEDs are emitting LEDs, as opposed to pump LEDs, and a QD layer is not aligned over the second array of LEDs. In an embodiment, the second array of LEDs are pump LEDs and may be designed to emit a peak emission wavelength between 380 nm and 420 nm. In such an embodiment, a second array of QD layers may be contained (e.g. embedded) within a second array of cavities formed in the bottom surface of the cover film, with the second array of QD layers aligned over the second array of LEDs.

The display panel may further include an array of light guides in the cover film over the array of cavities, where the light guides are characterized by a different refractive index than a bulk of the cover film. A transparent fill material may optionally be included within the array of cavities and over the array of QD layers within the array of cavities. In an embodiment, a Bragg reflector layer is formed over the array of LEDs and under the array of QD layers, where the Bragg reflector layer is reflective to a peak emission wavelength of the QDs contained within the array of QD layers. In an embodiment, a Bragg reflector layer is formed over the array of QD layers, where the Bragg reflector layer is transparent to the peak emission wavelength of the QDs contained within the array of QD layers and reflective of the peak emission wavelength of the array of LEDs.

In embodiment, a method of forming a display panel includes forming an array of cavities in a cover film, forming an array of QD layers within the array of cavities, and transferring the cover film including the array of QD layers to a display substrate, where the array of QD layers are aligned over an array of LEDs mounted on the display substrate. In an embodiment, the method includes laser fusing cover film regions over the array of cavities to alter a refractive index of the cover film regions.

In an embodiment, a display panel includes a display substrate, an array of LEDs mounted on the display substrate in an array of pixels, and an array of QD patches aligned over the array of LEDs, where each QD patch in the array of QD patches includes a planar top surface. The QD patches may include multiple layers, such as a QD layer, an optional color filter layer over the QD layer, and an optional Bragg reflector layer underneath the QD layer. In some embodiments, the array of LEDs is an array of pump LEDs designed to emit a peak emission wavelength between 380 nm and 420 nm. A second array of LEDs may be mounted on the display substrate within the array of pixels. The second array of LEDs may be emissive LEDs and may be designed to emit a peak emission wavelength above 438 nm. In such a configuration, an array of QD patches is not aligned over the second array of LEDs. In an embodiment, a second array of QD patches is aligned over the second array of LEDs. For example, the second array of QD patches may be designed to emit a different primary wavelength than the first array of QD patches. In an embodiment the second array of LEDs are pump LEDs designed to emit a peak emission wavelength between 380 nm and 420 nm.

In an embodiment, a method of forming a display panel includes electrostatically transferring an array of LEDs from an LED carrier substrate to a display substrate, and electrostatically transferring an array of QD patches from a QD patch carrier substrate to the display substrate, and aligning the array of QD patches over the array of LEDs. Each QD patch may have a planar top surface, for example, to facilitate contact with an array of electrostatic transfer heads. Each QD patch may additionally include a QD layer and a Bragg reflector layer under the QD layer. Each QD patch may include a color filter over the QD layer. The method may additionally include forming a planarization layer around the array of QD patches on the display substrate.

In an embodiment, a display panel includes an arrangement of LEDs mounted on a display substrate in an array of pixels. A planarization layer is over the array of LEDs, and the planarization layer includes an array of openings aligned over the array of LEDs. An array of QD layers is within the array of openings aligned over the array of LEDs. A top surface of each QD layer in the array of QD layers may be level with a top surface of the planarization layer (e.g. they may have been planarized). A Bragg reflector layer may be formed over the planarization layer, where the array of QD layers is over the Bragg reflector layer. A top surface of each QD layer in the array of QD layers may be level with a top surface of the Bragg reflector layer (e.g. they may have been planarized). Alternatively, a Bragg reflector layer may be formed over the array of LEDs and underneath the planarization layer and the array of QD layers. In some embodiments, the array of LEDs is an array of pump LEDs designed to emit a peak wavelength between 380 nm and 420 nm. In some embodiments, additional arrays of LEDs are mounted on the display substrate in the array of pixels. An additional array of LEDs may also be pump LEDs (e.g designed to emit a peak wavelength between 380 nm and 420 nm) or may be emitting LEDs (e.g. designed to emit a peak wavelength above 438 nm) without a QD layer aligned over the additional array of LEDs. In an embodiment, a Bragg reflector layer is formed over the array of QD layers and the planarization layer, where the Bragg reflector layer is transparent to the peak emission wavelength of the QDs contained within the array of QD layers and reflective of the peak emission wavelength of the array of LEDs.

BRIEF DESCRIPTION OF THE DRAWINGS

Embodiments are illustrated by way of example and not limitation in the Figures of the accompanying drawings.

DETAILED DESCRIPTION

Figure 1:
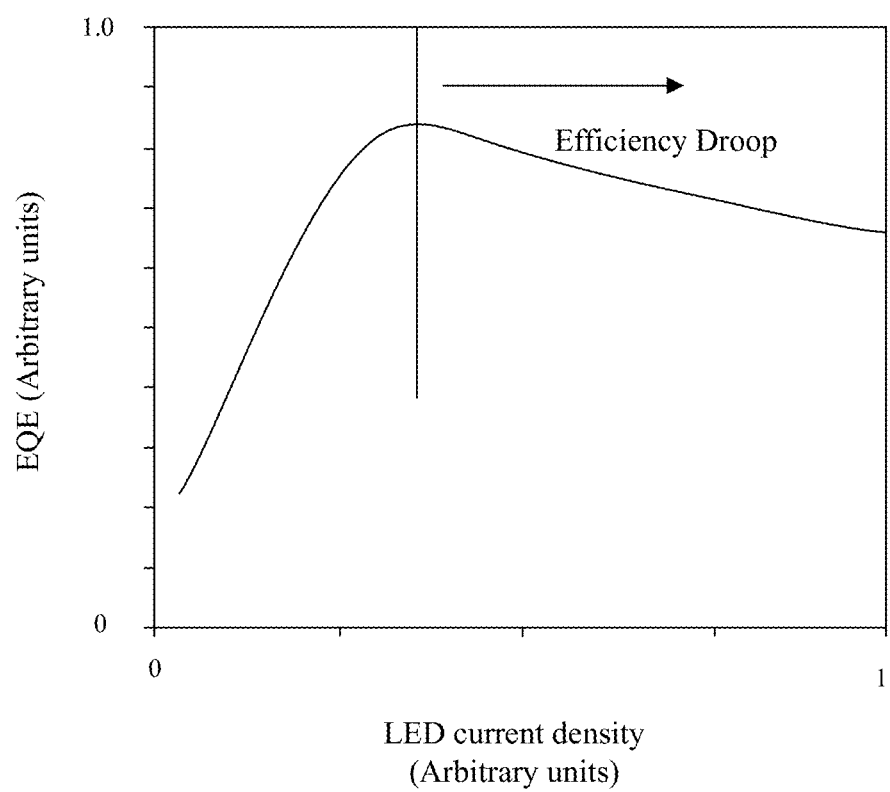
FIG. 1 is a generalized EQE curve for an inorganic semiconductor-based LED.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spans" and "on" as used herein may refer to a relative position of one layer with respect to other layers. One layer "above", "over", that "spans" or "on" another layer or bonded "to" or in "contact" with another layer may be directly in contact with the other layer or may have one or more intervening layers. One layer "between" layers may be directly in contact with the layers or may have one or more intervening layers.

In accordance with embodiments, a display panel and system is described including an arrangement of inorganic semiconductor-based LEDs and quantum dot layers within the display area of the display panel. In an embodiment, a display panel includes a plurality of LEDs mounted on a display substrate and arranged in a pixel in a pixel array. The display panel may be a low resolution display or high resolution display characterized by a high pixel per inch (PPI) density. The pixel may include a first subpixel designed to emit a first peak emission wavelength (e.g. in the red spectrum), a second LED in a second subpixel designed to emit a second peak emission wavelength (e.g. in the green spectrum), and a third LED in a third subpixel designed to emit a third peak emission wavelength (e.g. in the blue spectrum). A quantum dot layer can be aligned over any of the LEDs to emit any of the first, second, or third peak emission wavelengths. In an embodiment, the first LED has a peak emission wavelength between 340 nm and 420 nm, such as between 380 nm and 420 nm, and the quantum dot layer includes quantum dots designed to emit the first peak emission wavelength (e.g. in the red spectrum). Such an arrangement may allow for the integration of quantum dot layers over efficient pump LEDs in which a pump LED peak emission wavelength is converted by the quantum dot layer to the subpixel emission wavelength. Accordingly, this may allow for the integration of pump LEDs into subpixels which may have a higher efficiency than what is possible with a comparable inorganic semiconductor-based emissive LED at the same subpixel peak emission wavelength. Similar arrangements can be made for other subpixels, in which the quantum dot layers are designed to emit at the peak emission wavelengths of the subpixels, or alternatively the LEDs within the subpixels may be designed to emit at the peak emission wavelengths of the supixels. Various combinations are possible.

In an embodiment, an array of quantum dot layers is embedded in a cover film of a wavelength conversion cover over LEDs mounted on the display substrate. For example, the array of quantum dot layers can be formed within an array of cavities in the cover film. The cover film including the array of quantum dot layers can then be transferred to the display substrate and aligned over the LEDs mounted on the display substrate.

In an embodiment, an array of quantum dot patches, each with a planar top surface, are aligned over LEDs mounted on a display substrate. For example, the array of quantum dot patches can be electrostatically transferred from a carrier substrate to the display substrate using an array of electrostatic transfer heads.

In an embodiment, an array of quantum dot layers is within an array of openings formed in a planarization layer over an array of LEDs. For example, the planarization layer can formed on and patterned on the display substrate, and the array of quantum dot layers then formed within an array of openings patterned in the planarization layer. Alternatively, the array of quantum dot layers can be formed on the display substrate, followed by formation of the planarization layer. In an embodiment the array of quantum dot layers is formed by deposition and patterning. For example, the quantum dot layers may be formed with a photodefinable resist, either positive or negative.

Internal quantum efficiency (IQE) is a function of the quality and structure of an LED, while external quantum efficiency (EQE) is defined as the number of photons emitted divided by the number of electrons injected. EQE is a function of IQE and the light extraction efficiency of the LED. At low operating current densities (also called injection current density, or forward current density) the IQE and EQE of an LED initially increases as operating current density is increased, then begins to tail off as the operating current density is increased in the phenomenon known as the "efficiency droop." At lowest current densities the efficiency may be low due to the strong effect of defects or other processes by which electrons and holes recombine without the generation of light, called non-radiative recombination. As those defects become saturated radiative recombination dominates and efficiency is increased. An "efficiency droop" or gradual decrease in efficiency begins as the injection current density surpasses a characteristic value. A generalized EQE curve for an inorganic semiconductor-based LED is illustrated in FIG. 1. Conventional inorganic semiconductor-based LEDs used for solid state lighting applications and backlighting applications are commonly driven at current densities well into the efficiency droop region due to the requirement for high luminance (brightness), such as 1,000,000 Nits. In accordance with embodiments, LEDs and quantum dot layers may be integrated into display systems (e.g. mobile electronic devices) designed for target luminance values such as 300 Nit for indoor display applications and up to about 2,000 Nit for outdoor display applications, which is well below the normal or designed operating conditions for standard semiconductor-based LEDs.

In accordance with embodiments, display panels and display system are described in which the LEDs may be micro LEDs having a maximum lateral dimension of 1 to 300 µm, 1 to 100 µm, 1 to 20 µm, or more specifically 1 to 10 µm, such as 5 µm. At these dimensions the LEDs may be integrated into display systems with a wide range of resolutions, for example, lower than 40 pixels per inch (PPI) to greater than 440 PPI, so long as the subpixel pitch is less than the maximum width of the LEDs. Additionally, inorganic semiconductor-based LEDs may be characterized has having a higher efficiency and longer lifespan than common organic LEDs (OLEDs) commonly included in mobile electronics devices and televisions. Higher efficiency, in turn, may allow for lower energy or power usage for the display system. In accordance with embodiments, the LEDs may operate around the maximum efficiency in their characteristic EQE curves, or even in the "pre-droop" region of the EQE curve.

Referring again to FIG. 1, in some embodiments, the characteristic EQE curve of an LED may have a higher slope at the pre-droop region than in the efficiency droop region. As a result, small fluctuations in operating current density or variations in LED manufacturing and integration processes may result in wide fluctuations in EQE of the LEDs and resultant brightness of the display system. Additionally, LEDs designed for different color emission may be fabricated using different inorganic semiconductor-based systems. For example, blue or green emitting LEDs may be fabricated using inorganic semiconductor materials such as, but not limited to, GaN, AlGaN, InGaN, AlN, InAlN, AlInGaN. For example, red emitting LEDs may be fabricated using inorganic semiconductor materials such as, but not limited to, GaP, AlP, AlGaP, AlAs, AlGaAs, AlInGaP, AlGaAsP, and any As—P—Al—Ga—In. Variations in LED materials and processing conditions may result in a different characteristic EQE curve. For example, it has been observed that red emitting LEDs (e.g. including AlInGaP) have characteristic EQE curves with lower maximum efficiency than blue emitting LEDs (e.g. including AlGaN), and that the maximum efficiency of the EQE curve is shifted to the right at higher current densities. Thus, red emitting LEDs with similar shape as corresponding blue emitting LEDs may be driven at higher currents than the corresponding blue emitting LEDs to achieve similar brightness. It has additionally been observed that red emitting LEDs may be more susceptible to EQE shift due to operating temperature variations than the corresponding blue emitting LEDs. It is also anticipated that green emitting LEDs (e.g. including AlGaN) may suffer from a sustained efficiency gap compared to blue emitting LEDs with similar dimensions.

In one aspect, embodiments describe a display panel and system that allows some control of emission profile from the display without having to manipulate the LEDs to achieve a desired emission profile. For example, this may be accomplished by including less emissive LEDs within a display than there are subpixel emission colors within a pixel. This can be accomplished by including the same pump LEDs for one or more, or all, of the subpixels within a pixel. In this manner, rather than designing different materials systems and integration schemes for LEDs of different emission colors for each subpixel, a subset or all of the subpixels can include the same pump LED design with a known efficiency.

In some embodiments, QD layer thicknesses of 1-100 µm and packing densities of 1-60% may be utilized. Due to the LED dimensions and pitch, each QD layer or QD patch may have a limited footprint. The thickness of the QD layer within a subpixel may also be limited due to an aspect ratio limitation (e.g. viewing angle and PPI) for the display panel. In some embodiments, QD layer thicknesses of less than 20 µm, or even less than 5 µm are possible. Though, it is possible QD layers could be thicker, such as 50 µm or 100 µm. In some embodiments, the QD layer has a sufficiently high QD packing density (e.g. at least 20% by volume, or more specifically at least 40-50% by volume) in order to achieve sufficient pump LED absorption, with mitigated pump LED transmission (bleeding) through the QD layer and mitigated re-absorption of QD emission by the QDs themselves.

In accordance with embodiments, a display panel includes a pixel arrangement of inorganic semiconductor-based LEDs including a down-converting QD layer over at least one LED. For example, in one embodiment an RGB pixel may include a red emitting subpixel, a green emitting subpixel, and a blue emitting subpixel. In one aspect, the inefficiencies related to an emitting LED for a specific color is reduced by providing a QD layer over a pump LED with a higher efficiency. For example, red emitting pixel may include a QD layer over a blue or deep blue emitting pump LED. Similarly, a QD layer may be formed over a blue or deep blue pump LED for down conversion into a number of possible emission colors, including green, blue, and others.

The CIE 1931 color spaces adopted by the International Commission on Illumination (CIE) define quantitative links between colors in the visible spectrum, and perceived colors in human color vision. Once such color space is the CIE XYZ color space, which encompasses all color sensations for a human standard observer. The CIE XYZ color space defines y as luminance, z as quasi-blue stimulation, and x as a combination of cone response curves chosen to be non-negative. The CIE color matching functions are a numerical description of the chromatic response of a human standard observer (tri stimulus value) over the visible spectrum. A CIE 1931 color matching function is reproduced in FIG. 2. As shown, the z plot of quasi-blue stimulation has a peak around 448 nm.

Figure 2:
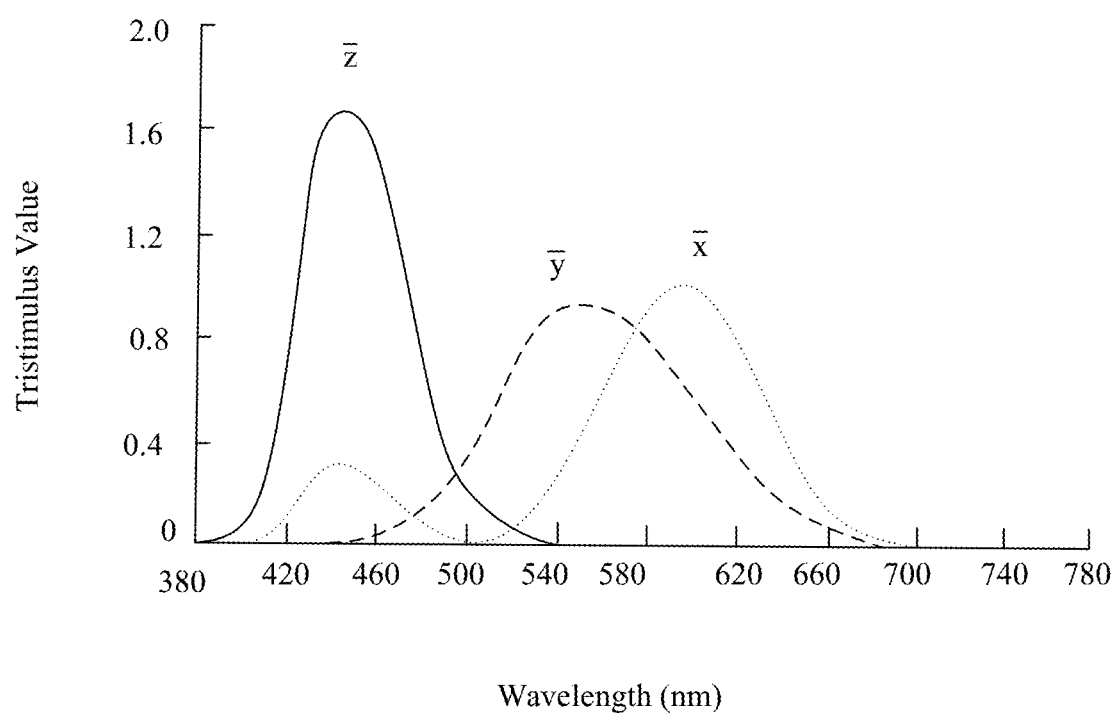
FIG. 2 is a graphical illustration of a CIE 1931 color matching function.

In one aspect, embodiments describe the use of a UV emitting LED (e.g. between 340 nm and 380 nm) or deep blue emitting LED (e.g. between 380 nm and 420 nm) as a pump LED with mitigated color erosion. As shown in FIG. 2, a human standard observer will have a lower chromatic response of a deep blue emitting LED (e.g. between 380 nm and 420 nm) compared to a blue emitting LED closer to the peak tristimulus value around 448 nm. The chromatic response may be negligible at the upper UV range limit (e.g. from 340 to 380 nm). In other embodiments, the pump LED may have a peak emission wavelength that is shorter than the first absorption peak in the QD absorption spectrum (e.g. band edge). For example, this may be any wavelength below 500 nm.

Figure 3:
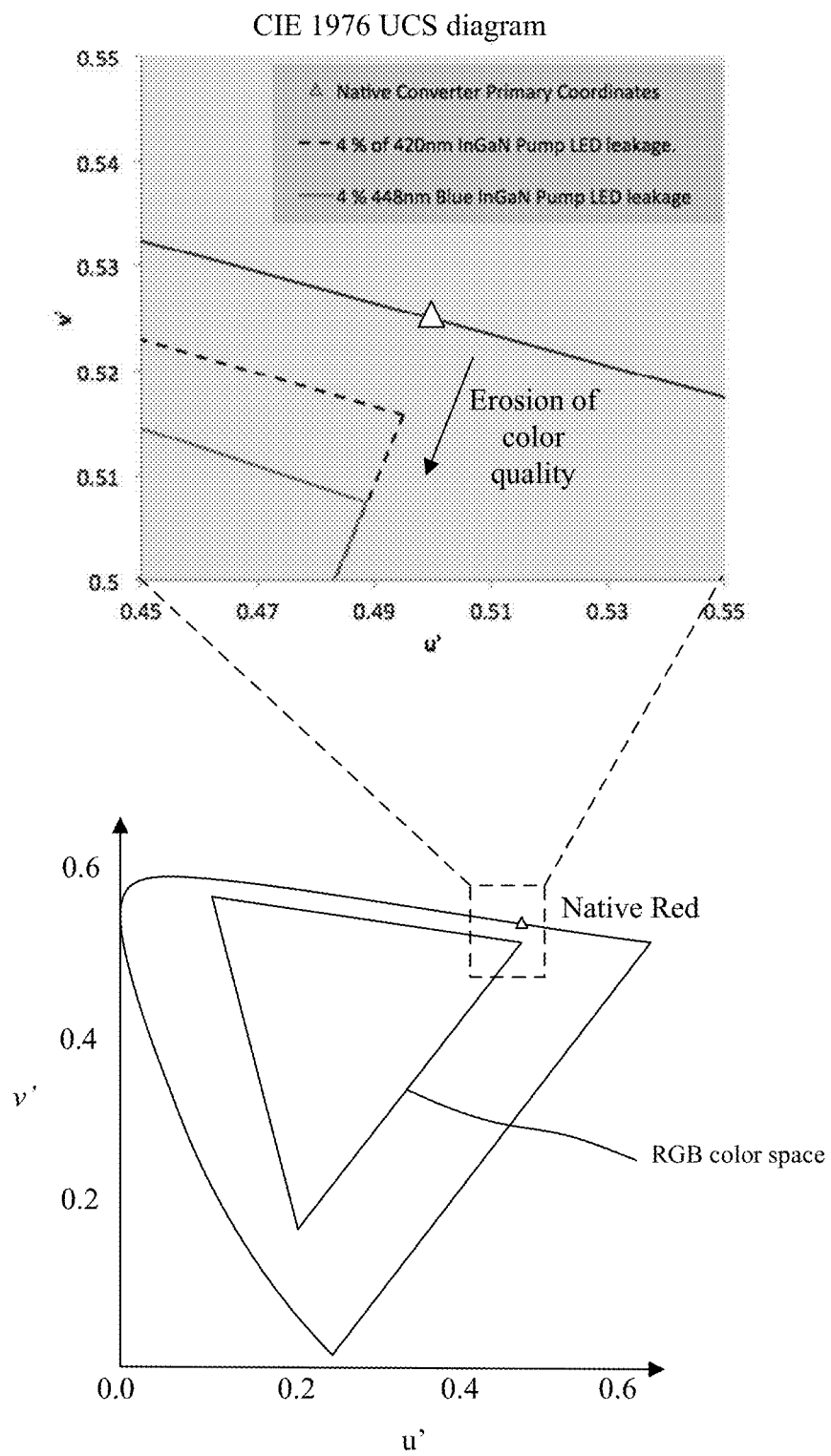
FIG. 3 is an illustration of an RGB display color space overlaying a CIE 1976 uniform chromacity diagram (CIE 1976 UCS diagram).

In application, a QD layer may not down-convert 100% of light emitted from the underlying pump LED. Accordingly, it is possible some amount of the pump LED light may bleed through the QD layer and potentially erode the color quality of the display. Referring now to FIG. 3, an exemplary overlay of an RGB display color space is provided over a CIE 1976 uniform chromacity diagram (CIE 1976 UCS diagram). The RBG display color space is intended for exemplary purposes, and embodiments are not limited to the specific RGB color space provided. In the particular illustration, simulation data is provided for two exemplary red subpixel configurations to illustrate the effect of pump LED leakage on color quality. In the first sample illustrated as a dotted line in the close up illustration, a red converter QD layer (centered at 625.5 nm peak emission wavelength) is formed over a pump LED with a peak emission wavelength of 420 nm, and a presumed 4% leakage of the pump LED light. In the second sample illustrated as a solid line in the close up illustration, a red converter QD layer (centered at 625.5 nm peak emission wavelength) is formed over a blue emitting pump LED with a peak emission wavelength of 448 nm, and a presumed 4% leakage of the pump LED light. As shown, the resulting color coordinates of the RGB color space is shifted (or eroded) more with leakage of 448 nm light than for 420 nm light. Thus, not only is the RGB color space eroded more significantly with leakage of 448 nm light, the reproducible red color quality is also eroded more significantly with leakage of 448 nm light compared to 420 nm light.

Figure 4:
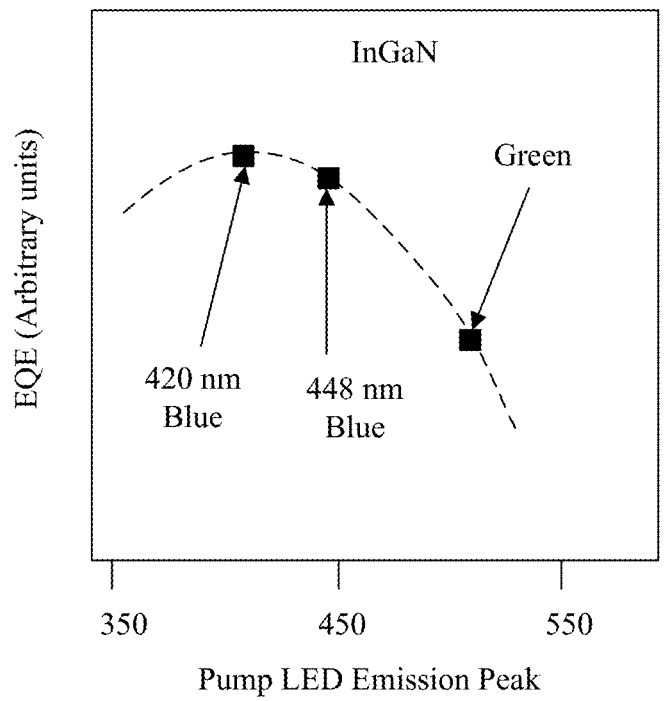
FIG. 4 is a graphical illustration of peak EQE values for InGaN-based LEDs designed for different color emission in accordance with an embodiment.

In one aspect, embodiments describe the use of an efficient deep blue emitting LED (e.g. between 380 nm and 420 nm, or lower) or UV emitting LED at the upper UV range (e.g. from 340 to 380 nm) as a pump LED. As described, variations in LED materials and processing conditions may result in a different characteristic EQE curve. For example, it has been observed that red emitting LEDs (e.g. including AlInGaP) have characteristic EQE curves with lower maximum efficiency than blue emitting LEDs (e.g. including AlGaN). Furthermore, changes in composition within the same semiconductor systems can result in different emission wavelengths with different characteristic EQE curves. For example, the AlGaN semiconductor system can be used to fabricate deep blue, blue, and green emitting LEDs. FIG. 4 is a graphical illustration of peak EQE values for InGaN-based LEDs designed for different color emission in accordance with an embodiment. In the embodiment illustrated in FIG. 4, an LED designed for peak emission at 420 nm has a higher EQE than an LED designed for peak emission at 448 nm. As a result, implementation of pump LEDs with peak emission wavelengths between 380 nm and 420 nm, or lower, such as from 340 nm to 380 nm, in accordance with embodiments may correspond to higher efficiency, and allow for lower energy or power usage for the display system. In other embodiments, the pump LED may have a peak emission wavelength that is shorter than the first absorption peak in the QD absorption spectrum (e.g. band edge). For example, this may be any wavelength below 500 nm.

In one aspect, embodiments describe the use of a deep blue emitting LED (e.g. between 380 nm and 420 nm, or lower) or UV emitting LED at the upper UV range (e.g. from 340 to 380 nm) as a pump LED in order to facilitate higher absorption by the QDs. It has been observed that lower wavelengths of pump LED light, and hence higher energy, facilitates a higher state in the band gap of a QD. As a result, lower pump LED wavelengths may result in higher absorption coefficients of the QD layers. In accordance with embodiments, this may allow for thinner QD layers (facilitating conformance to pixel aspect ratios), lower concentrations of QDs in the QD layers, and lower pump leakage through the QD layers (less color desaturation).

Figure 5:
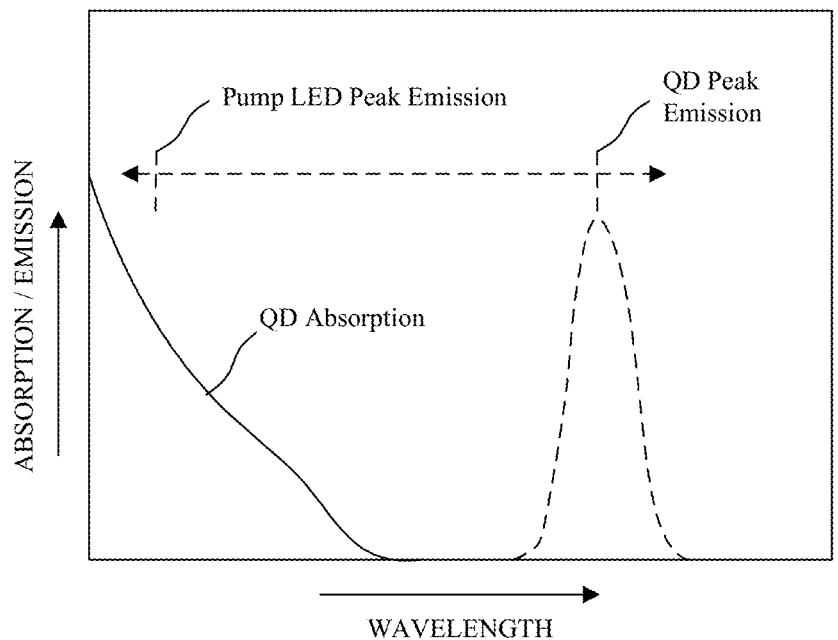
FIG. 5 is a schematic illustration of the relationship of QD peak emission, QD absorption, and pump LED peak emission in accordance with an embodiment.

FIG. 5 is a schematic illustration of the relationship of QD peak emission, QD absorption, and pump LED peak emission in accordance with an embodiment. As shown, QDs may generally have higher absorption coefficients of pump LED light at lower wavelengths, due to the higher energy of pump light at lower wavelengths. For example, the QD absorption coefficient of UV LED peak emission at the upper UV range (e.g. from 340 to 380 nm) or deep blue LED peak emission (e.g. between 380 nm and 420 nm, or lower) may be greater than for blue LED peak emission at the low end of the blue spectrum near the peak tristimulus value (e.g. 448 nm+/−10 nm). Quantum dots may be selected to eliminate or reduce any overlap between the QD absorption spectrum and the QD emission spectrum. For example, a QD may be selected with a red or green emission spectrum, with no or minimal overlap with the QD absorption spectrum. This may allow for mitigated re-absorption of QD emitted light by the QDs themselves, resulting in higher efficiency. In other embodiments, the pump LED may have a peak emission wavelength that is shorter than the first absorption peak in the QD absorption spectrum (e.g. band edge). For example, this may be any wavelength below 500 nm.

Figure 6:
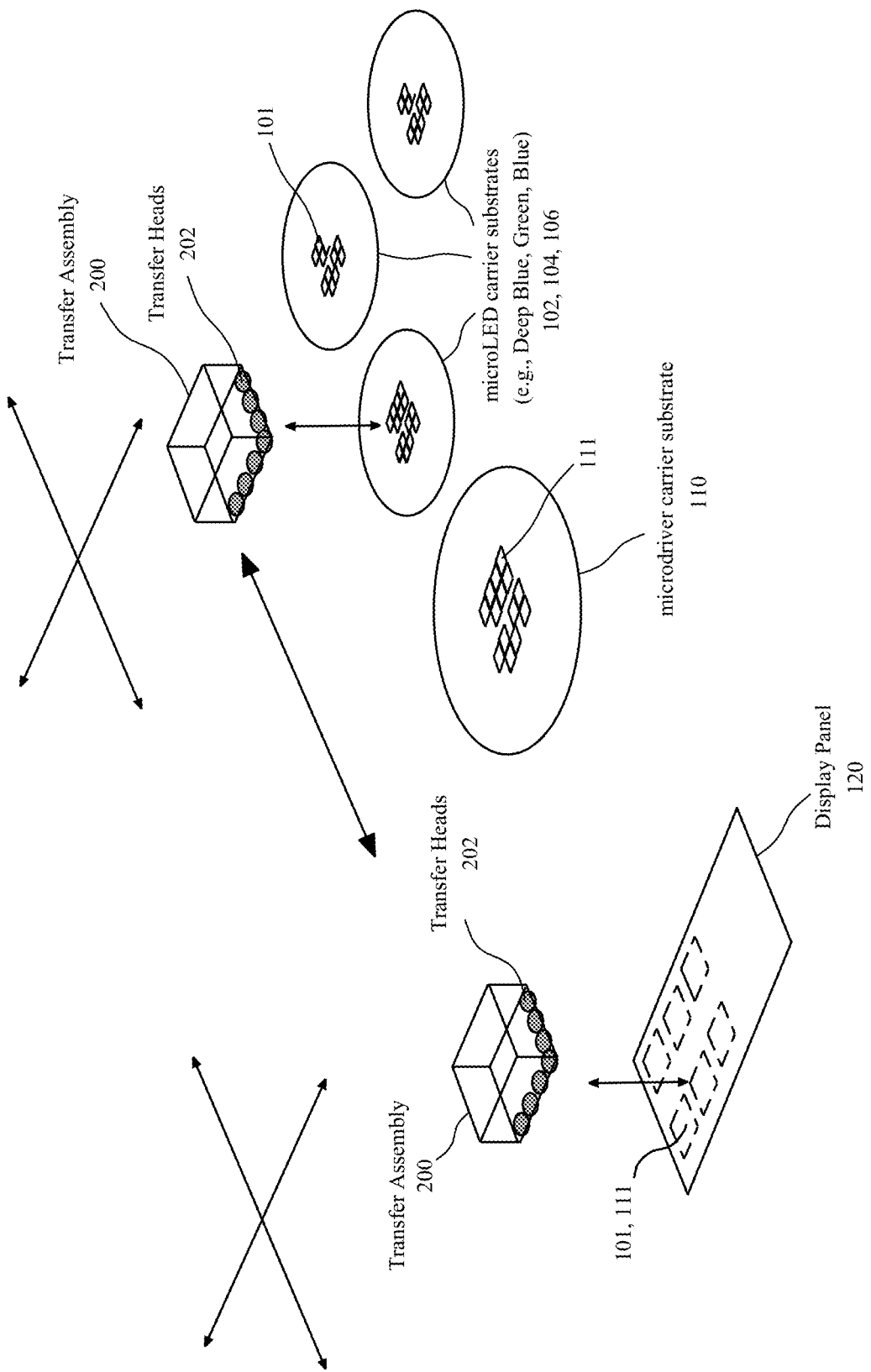
FIG. 6 is an illustration of a process for transferring microdrivers and micro LEDs from carrier substrates to a display panel in accordance with an embodiment.

Referring now to FIG. 6 an illustration is provided of a process for transferring microdrivers and micro LEDs from carrier substrates to a display panel in accordance with an embodiment. Separate carrier substrates are used for each micro LED 101 color and for the microdrivers 111. One or more transfer assemblies 200 including an array of electrostatic transfer heads 202 can be used to pick up and transfer microstructures from the carrier substrates (e.g., 102, 104, 106, 110) to the receiving substrate, such as display panel 120. In one embodiment, separate transfer assemblies 200 are used to transfer any combination of micro LED 101 colors and for the microdrivers 111. The display panel is prepared with distribution lines to connect the various the micro LED and microdriver structures. Multiple distribution lines can be coupled to landing pads and an interconnect structure, to electrically couple the micro LEDs and the microdrivers, and to couple the various microdrivers to each other. The receiving substrate can be a display panel 120 of any size ranging from micro displays to large area displays, or can be a lighting substrate, for LED lighting, or for use as an LED backlight for an LCD display. The micro LED and microdriver structures are surface mounted on the same side of the substrate surface.

Bonds (e.g. from surface mounting) can be made using various connections such as, but not limited to, pins, conductive pads, conductive bumps, and conductive balls. Metals, metal alloys, solders, conductive polymers, or conductive oxides can be used as the conductive materials forming the pins, pads, bumps, or balls. In an embodiment, heat and/or pressure can be transferred from the array of transfer heads to facilitate bonding. In an embodiment, conductive contacts on the microdriver and micro LEDs are thermocompression bonded to conductive pads on the substrate. In this manner, the bonds may function as electrical connections to the microdriver chips and micro LEDs. In an embodiment, bonding includes bonding the conductive contacts on the microdriver chips and micro LEDs with the conductive pads on the display panel. For example, the bonds may be intermetallic compounds or alloy bonds of materials such as indium and gold. Other exemplary bonding methods that may be utilized with embodiments of the invention include, but are not limited to, thermal bonding and thermosonic bonding. In an embodiment, the microdriver and micro LEDs are bonded to landing pads in electrical connection with the distribution lines on the substrate to electrically couple one or more micro LEDs, pixels of micro LEDs, to a corresponding microdriver.

Figure 7:
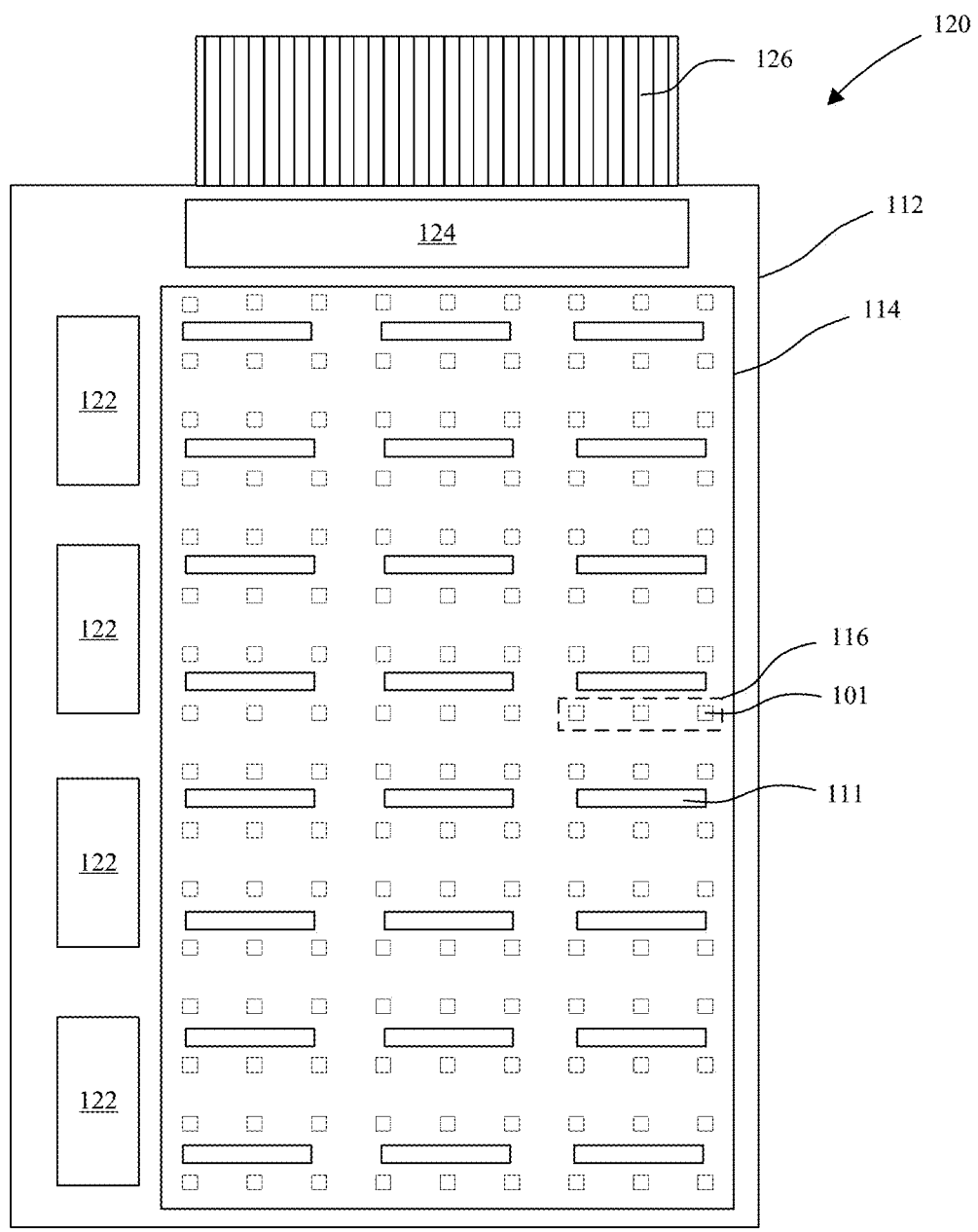
FIG. 7 is a schematic top view illustration of a display panel in accordance with an embodiment.

FIG. 7 is a schematic top view illustration of a display panel in accordance with an embodiment. As shown, the display panel 120 may include a display substrate 112 including a display area 114 within which the LEDs 101 are located, for example, in a matrix of pixels 116. Each pixel may include multiple subpixels that emit different colors of lights. In a red-green-blue (RGB) subpixel arrangement, each pixel may include three subpixels that emit red light, green light, and blue light, respectively. It is to be appreciated that the RGB arrangement is exemplary and that this disclosure is not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels.

One or more LEDs 101 may connect to a microdriver 111 that drives the one or more LEDs 101. For example, the microdrivers 111 and LEDs 101 may be surface mounted on the display substrate 112. Display panel 120 may include column driver(s) 124 (e.g. including column selection logic) and/or row driver(s) 122 (e.g. including row selection logic). Column drivers 124 may include individual drivers for each column of microdrivers 111. Row drivers 122 may include individual drivers for each row of LEDs 101. A flex circuit 126 may be used for connection of the display panel 120 components to additional system components.

Figure 8:
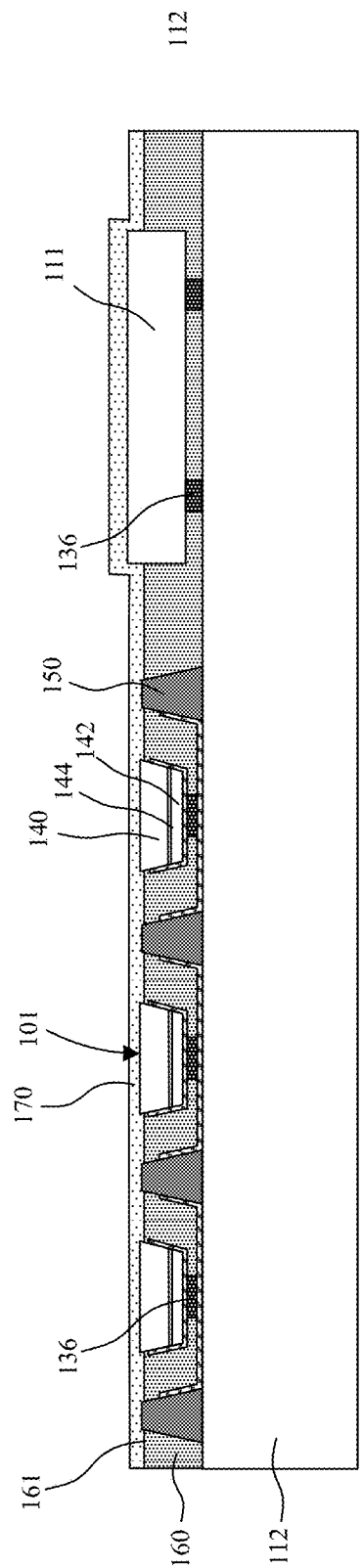
FIG. 8 is a schematic cross-sectional side view illustration of a portion of a display panel active area in accordance with an embodiment.

FIG. 8 is a schematic cross-sectional side view illustration of a portion of a display panel active area in accordance with an embodiment. The display substrate 112 may be a variety of substrates in accordance with embodiments, the display substrate 112 may be a thin film substrate (TFT) substrate similar to conventional OLED display substrates. Thus, while the particular embodiments illustrated include an array of microdrivers 111 mounted on the display substrate 112, this is exemplary, and embodiments do not necessarily require microdrivers 111 mounted on the display substrate. Display substrate 112 may be rigid or flexible. For example, display substrate 112 may be formed of a variety of materials such as polymer, glass, silicon, metal foil, etc. As shown a bank layer 150 may optionally be formed on display substrate 112. Openings may be formed within the bank layer 150 to define subpixel areas for LEDs 101, and optionally for microdrivers 111 when the display substrate does not include all of the driving circuits for operating the LEDs 101. LEDs 101 and microdrivers 111 may be bonded to bottom electrode contact pads of the display substrate 112 with electrically conductive bumps 136, e.g. solder bumps.

Still referring to FIG. 8 a passivation layer 160 may be formed over the display substrate 112 and laterally around the LEDs 101 and optionally microdrivers 111. Passivation layer may be formed using a variety of techniques. For example, passivation layer can be slot coated, slit coated, or spin coated on the display substrate 112 to form a layer with a level top surface 161 across the display substrate. Passivation layer 160 can be formed using other techniques such as ink jetting, physical vapor deposition (PVD) or chemical vapor deposition (CVD). In an embodiment, the LED 101 includes a quantum well layer 144 between doped layers 140 (e.g. n-doped), 142 (e.g. p-doped) though the doping may be reversed. The passivation layer 160 may additionally provide step coverage for the deposition of a top electrode layer 170 such as indium tin oxide (ITO) or poly(3,4-ethylenedioxythiophene) (PEDOT). The passivation layer 160 may perform a variety of functions, including securing the LEDs 101 and microdrivers 111 onto the display substrate 112, passivating sidewalls of the LEDs 101 to protect against shorting between doped layers 140, 142, and acting as a leveling surface for the formation of the top electrode layer 170 without breaks due to changes in topography of the surface onto which the top electrode layer 170 is formed.

Quantum dots are semiconductor materials where the size of the structure is small enough (e.g. less than tens of nanometers) that the electrical and optical characteristics differ from the bum properties due to quantum conferment effects. For example, the emission properties of quantum dots are related to their size and shape in addition to their composition. Fluorescence of quantum dots is a result of exciting a valence electron by absorbing a certain wavelength, followed by the emission of lower energy in the form of photons as the excited electrons return to the ground state. Quantum confinement causes the energy difference between the valence and conduction bands to change based on size and shape of the quantum dot meaning that the energy and wavelength of the emitted photos is determined by the size and shape of the quantum dot. The larger the quantum dot, the lower the energy of its fluorescence spectrum. Accordingly, smaller quantum dots emit bluer light (higher energy) and larger quantum dots emit redder light (lower energy). This allows size-dependent tuning of the semiconductor photoluminescence emission wavelength throughout the visible spectrum, with a sharp emission spectrum and high quantum efficiency.

Examples of quantum dot materials include, but are not limited to, groups of II-VI, III-V, IV-VI semiconductor materials. Some exemplary compound semiconductors include CdS, CdSe, CdTe, ZnS, ZnSe, ZnTe, GaAs, GaP, GaAs, GaSb, HgS, HgSe, HgTe, InAs, InP, InSb, AlAs, AlP, AlSb. Some exemplary alloyed semiconductors include InGaP, ZnSeTe, ZnCdS, ZnCdSe, and CdSeS. Multi-core structures are also possible. Exemplary multi-core configurations may include a semiconductor core material, a thin metal layer to protect the core from oxidation and to aid lattice matching, and a shell to enhance the luminescence properties. The shell may function to absorb light at a specific spectrum that is different from the emission spectrum from the quantum dot. The core and shell layers may be formed of the same material, and may be formed of any of the exemplary compound semiconductors or alloyed semiconductors listed above. The metal layer often comprises Zn or Cd.

Figure 9:
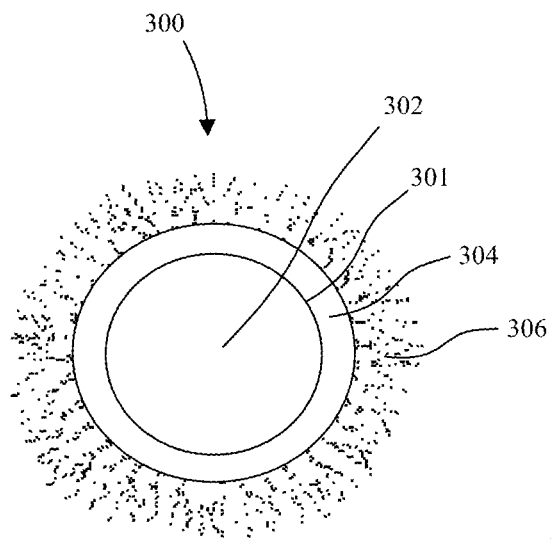
FIG. 9 is a schematic cross-sectional side view illustration of a bare core-shell quantum dot with bound ligands in accordance with an embodiment.

FIG. 9 is a schematic cross-sectional side view illustration of a bare core-shell quantum dot with bound ligands in accordance with embodiments. As shown, quantum dot 300 includes a core 302 and shell 304 surrounding the core 302 as described above, and optionally a metal layer 301 between the core 302 and shell 304. In an embodiment, organic or inorganic ligands 306 are bound to the shell 304 surface. In an embodiment, the organic or inorganic ligands 306 are inside of an organic (e.g. polymer) or inorganic (e.g. metal oxide or glass) matrix surrounding the shell 304.

Figure 10:
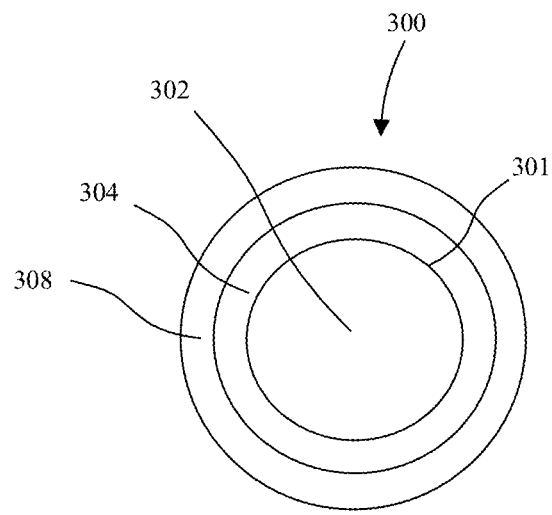
FIG. 10 is a schematic cross-sectional side view illustration of a nano-encapsulated quantum dot in accordance with embodiments.

FIG. 10 is a schematic cross-sectional side view illustration of a nano-encapsulated quantum dot in accordance with embodiments. As shown, quantum dot 300 illustrated in FIG. 10 includes a core 302 and shell 304 surrounding the core 302, optional metal layer 301 between the core and shell, and a barrier layer 308 to provide surface protection from chemical species, oxygen, and water. For example, the barrier layer 308 may be a metal oxide. In accordance with embodiments, the nano-encapsulated quantum dots 300 illustrated in FIG. 10 can be embedded inside of an organic (e.g. polymer) or inorganic (e.g. metal oxide or glass) matrix, or used as neat particles to form a quantum dot layer. In an embodiment, organic or inorganic ligands 306 are bound to the barrier layer 308 surface, similarly as described with regard to FIG. 9. In an embodiment, the organic or inorganic ligands 306 are inside of an organic (e.g. polymer) or inorganic (e.g. metal oxide or glass) matrix surrounding the barrier layer 308.

Figure 11:
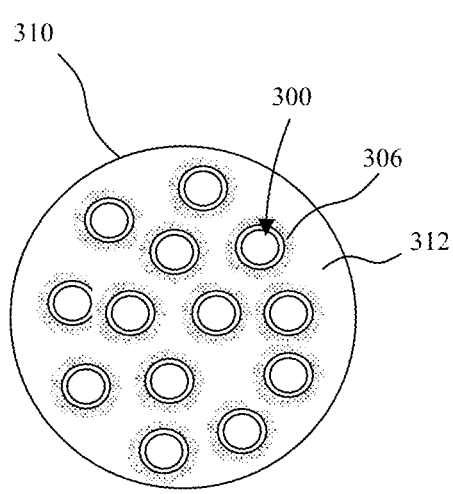
FIG. 11 is a schematic cross-sectional side view illustration of a micro-encapsulated quantum dot in accordance with embodiments.

FIG. 11 is a schematic cross-sectional side view illustration of a micro-encapsulated quantum dot in accordance with embodiments. As shown, quantum dots 300 (e.g. bare quantum dots as described above with regard to FIG. 9, or nano-encapsulated quantum dots as described above with regard to FIG. 10) are embedded inside a matrix 312 formed into a large nano or micro sized bead 310. The matrix 312 may be formed of a variety of inorganic materials such as, but not limited to, metal oxide, glass, sol-gel (e.g. $SiO_2$, etc.) or organic materials such as, but not limited to, acrylates, silicon, epoxy, and other polymeric materials.

Figure 12A:
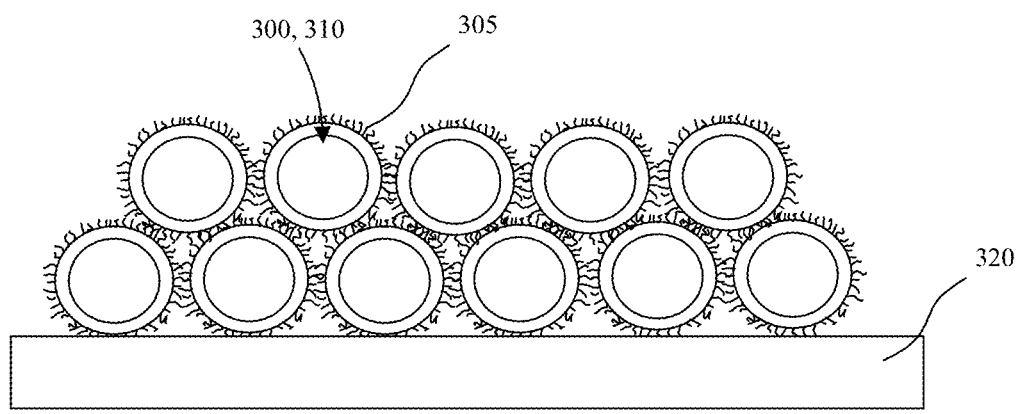
FIGS. 12A-12B are schematic cross-sectional side view illustrations for a method of forming a quantum dot layer in accordance with an embodiment.
Figure 12B:
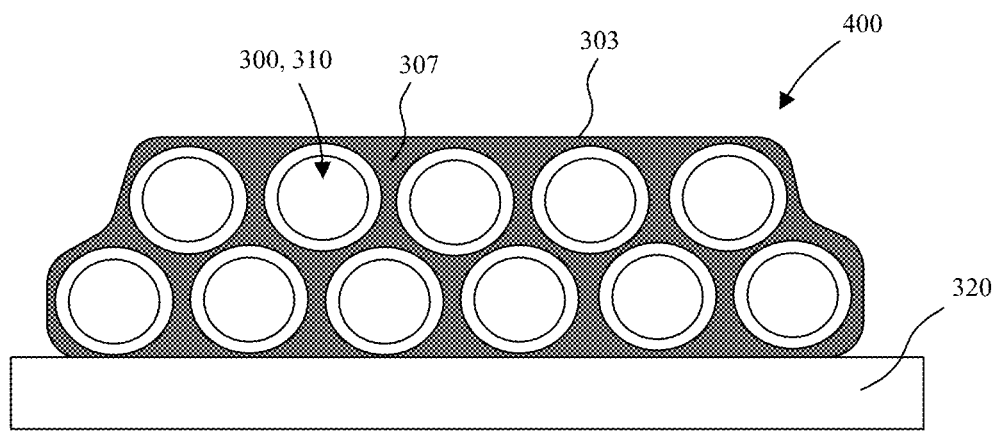

Referring now to FIGS. 12A-12B one embodiment for a method of forming a quantum dot layer 400 is illustrated. As shown, QDs 300 or beads 310 (both of which are referred to herein as particles) are functionalized with crosslinkable/polymerizable groups 305 (which may be on ligands). In order to form quantum dot layer 400, the functionalized quantum dots 300 or beads 310 may be dispersed in a solvent (and any other chemical species that may facilitate particle-particle crosslinking), coated into a substrate 320, followed by driving off of the solvent resulting in a dense packed quantum dot layer 400. Heat and/or light may then be applied to drive a chemical reaction between the functional groups 305 on the quantum dots 300 or beads 310 to cross-link them to one another to form liking moieties and create the cross-linked matrix 307 of close-packed quantum dots 300 or beads 310. The solvent and particle solution can be applied to the substrate 320 in a variety of manners including ink jetting, slot die coating, slit coating, screen printing, spin coating, etc. In an embodiment, it is the linking moieties between the ligands bound to the surface of the particles (QDs 300 or beads 310) that form the cross-linked matrix 307. The QD layer 400 can then be planarized to form a planar top surface 303, and optionally patterned into discrete, separate patches.

Various click chemistries may be used to generate the cross-linked matrix 307, such as [3+2] cycloadditions (e.g. Huisgen 1,3-dipolar cycloaddition), thiol-ene click reactions, Diels-Alder reaction and inverse electron demand Diels-Alder reactions, [4+1] cycloadditions between isonitriles (isocyanides) and tetrazines, nucleophilic substitution especially to small strained rings like epoxy and aziridine compounds, carbonyl-chemistry-like formation of ureas, and addition reactions to carbon-carbon double bonds like dihydroxylation or the alkynes in the thiol-yne reaction.

In one example, the cross-linked matrix 307 may include a thiol-yne linking moiety formed by cross-linking thiol and alkyne functional groups, e.g. alkyne hydrothiolation. In such an embodiment, the particles are functionalized with a thiol and alkyne, or particles functionalized with a thiol are mixed together with particles functionalized with alkynes. The functional groups on the ligands react to form the linking moiety resulting in the cross-linked matrix 307.

In one example, the cross-linked matrix 307 may be formed by a cycloaddition reaction. In an embodiment, an isoxazoline or isoxazolidine linking moiety may be formed by a thermal cycloaddition reaction of a nitrone with an alkene. In an embodiment, the linking moiety may be formed by photochemical cycloaddition, such as dimerization of two alkenes facilitated by UV light. A variety of additional cycloaddition reactions are possible for forming linking moieties, such as the reaction of an azido and alykyne (e.g. azido-functionalized particles and cyclooctyne functionalized particles), Norbornene-tetrazine cycloaddition, or cycloaddition of dibenzocyclooctynes and azides.

In one example, the cross-linked matrix 307 may be formed by a carbonyl-chemistry reaction, for example to form a urea, thiourea, aromatic hetercycle, oxide ether, hydrazone, or amide linking moiety. In an embodiment, a urea is formed via carboxylic azides to produce an isocyanate, which reacts with an amine to form the urea.

Figure 13A:
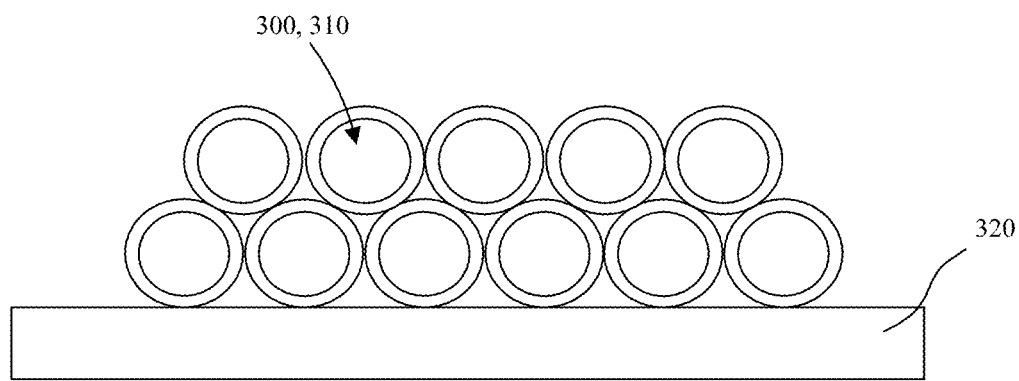
FIGS. 13A-13B are schematic cross-sectional side view illustrations for a method of forming a quantum dot layer in accordance with an embodiment.
Figure 13B:
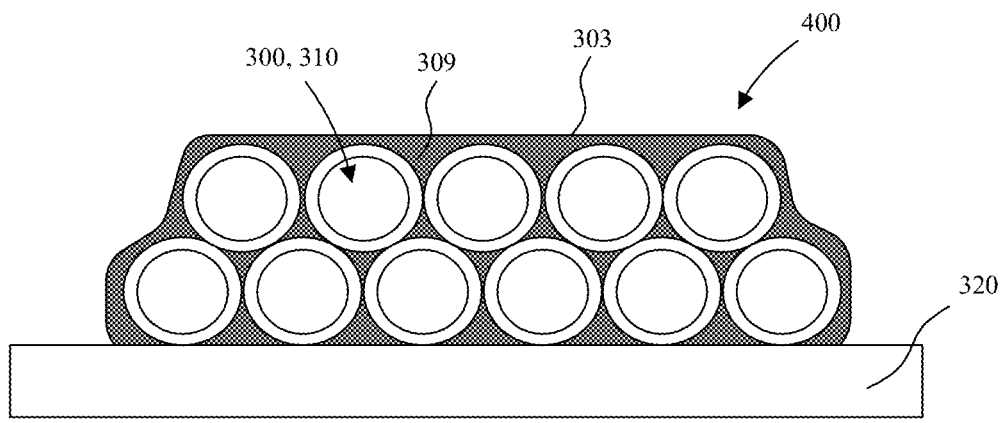

FIGS. 13A-13B illustrated another method of forming a quantum dot layer 400 in accordance with an embodiment. As shown, QDs 300 or beads 310 (both of which are referred to herein as particles) may be dispersed in a solvent and coated into a substrate 320, followed by driving off of the solvent resulting in dense packed QDs particle film. The solvent and particle solution can be applied to the substrate 320 in a variety of manners including ink jetting, slot die coating, slit coating, screen printing, spin coating, etc. Following removal of the solvent, the particle film may be coated with a film 309, such as an atomic layer deposition (ALD) film that penetrates and fills in between the particles, locking them together. The QD layer 400 can then be planarized to form planar top surface 303, and optionally patterned into discrete, separate patches. In another embodiment, the dense packed QD particle film could be filled in with a spin-on-glass (sol-gel) that is then cross-linked (e.g. upon exposure to heat). In order to mitigate shrinkage that may occur due to removal of solvent and densification of the film from cross-linking, the solvent and cure can be performed multiple times. The QD layer 400 can then be planarized to form planar top surface 303, and optionally patterned into discrete, separate patches.

Embodiments are not limited to dense packed QD layers 400 illustrated and described with regard to FIGS. 12A-13B. For example, QDs 300 or beads 310 can be dispersed within a transparent matrix material, such as glass or polymer (e.g. acrylic). In an embodiment, QDs 300 or beads 310 are dispersed in a photodefinable resist, which can be positive or negative. Other materials may also be dispersed within the matrix material such as a light scattering agent such as $TiO_2$ or $Al_2O_3$ particles. Such light scattering particles may have the effect of increasing quantum dot efficiencies by increasing scattered pump LED light within the QD layer 400 and interaction with the quantum dots. This may be accomplished by tuning the size of the light scattering particles to primarily scatter the pump LED light peak emission wavelength, will much less to negligible scattering of the QD peak emission wavelength.

QD layers 400 in accordance with embodiments may be integrated into a variety of configurations, and assume a variety of form factors. In some embodiments, QD layer 400 thicknesses of less than 20 µm, or even less than 5 µm are possible. In some embodiments, the QD layer has a sufficiently high QD packing density (e.g. at least 20% by volume, or more specifically at least 40-50% by volume) in order to achieve sufficient pump LED absorption, with mitigated pump LED transmission (bleeding) through the QD layer and mitigated re-absorption of QD emission by the QDs themselves. As used herein, the term packing density is refers to the QD particle components (e.g. inorganic components) such as core 302, metal layer 301, shell 304, and barrier layer 308. Ligands 306, and consequently the cross-linked matrix 307 or film 309 are not particle components within the meaning of packing density for determine volume loading of the QDs within a QD layer.

Referring now to FIGS. 14A-14E various LED and quantum dot layer arrangements in a RGB pixel system are illustrated in accordance with embodiments. It is to be appreciated that the RGB pixel system is exemplary and the embodiments are not so limited. Examples of other pixel systems that can be utilized include, but are not limited to, red-green-blue-yellow (RGBY), red-green-blue-yellow-cyan (RGBYC), red-green-blue-white (RGBW), or other pixel systems where the pixels have a different number of subpixels.

Figure 14A:
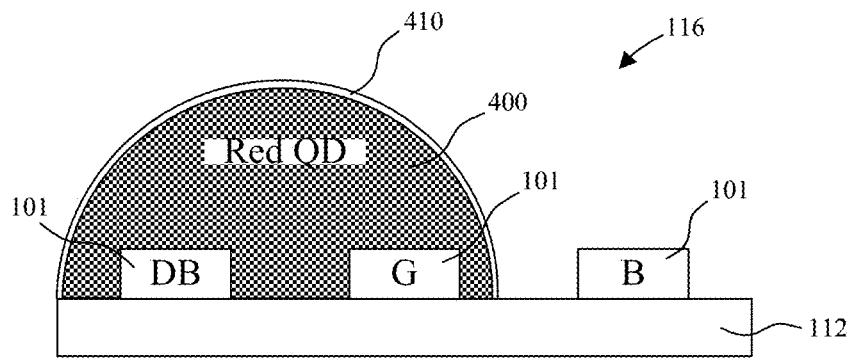
FIGS. 14A-14E are schematic cross-sectional side view illustrations of LED and quantum dot layer arrangements in a RGB pixel system in accordance with embodiments.
Figure 14B:
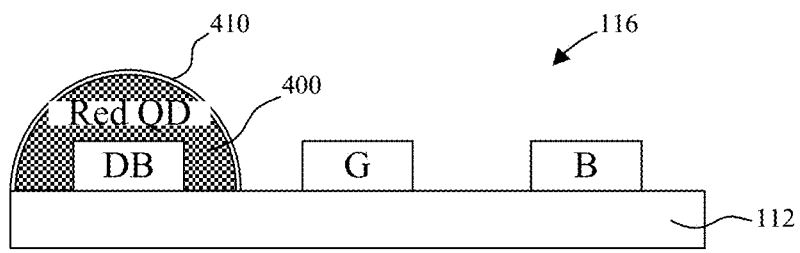
Figure 14C:
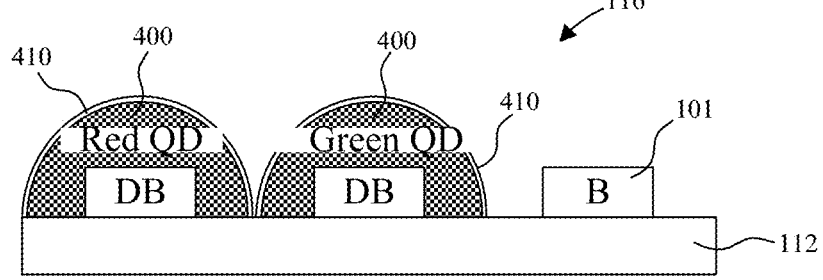
Figure 14D:
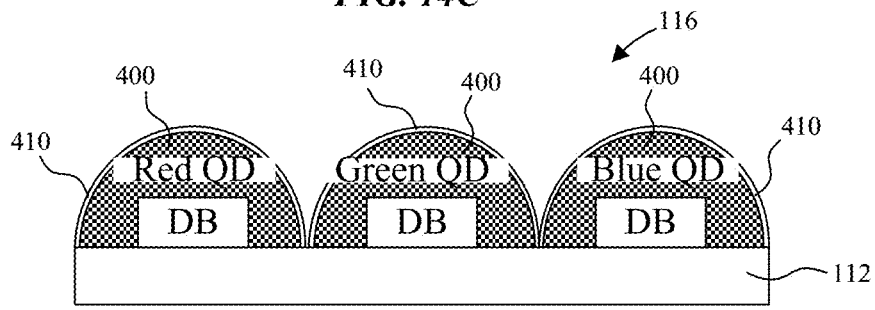
Figure 14E:
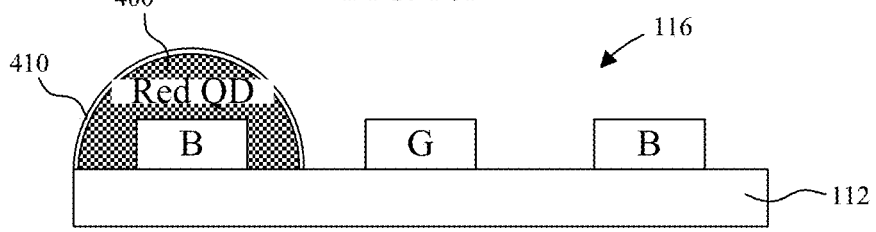

In the embodiment illustrated in FIG. 14A, a pixel 116 includes a blue emitting LED 101, a green (G) emitting LED 101, and a blue (B) or deep blue (DB) emitting pump LED 101. A quantum dot layer 400 is formed over the (e.g. deep blue) pump LED 101, and optionally over the green mitting LED 101. The quantum dot layer 400 may include red-emitting QDs in the embodiment illustrated for an RGB pixel. Referring briefly back to FIG. 5, in an embodiment, the QDs in the quantum dot layer 400 have an absorption band spectrally shifted to lower wavelengths with little absorption in the green or red spectrums. Likewise the pump LED peak emission is shifted to a lower wavelength (e.g. deep blue). This may allow for very low re-absorption, and better efficiency. Where there is limited to no overlap between the QD absorbance spectrum and the green or red emitting LED spectrums, it is possible that the quantum dot layer 400 can overlap both the deep blue pump LED and an adjacent emissive LED (e.g. green). This may allow for a greater footprint, and height of the QD layer 400 alleviating potential density-related challenges for a display with high PPI.

In an embodiment, a scattering agent is included within the QD layer 400. For example, the scattering agent could be particles (e.g. $TiO_2$ or $Al_2O_3$) designed to scatter primarily the pump LED light to increase interaction of the pump LED light with the QDs and mitigate leakage of the pump LED light. To mitigate pump LED leakage, a color filter layer 410 can optionally be formed over the QD layer 400 to absorb wavelengths at the pump LED emission spectrum (e.g. deep blue filter). For example, the color filter layer 410 may include a pigment or dye dispersed in a transparent matrix material.

Referring now to FIGS. 14B-14E, additional LED and quantum dot layer arrangements in a RGB pixel system are illustrated in accordance with embodiments. While specific arrangements utilizing a deep blue emitting pump LED are shown, embodiments are not so limited, and a variety of other pump LEDs may be used. For example, any of the DB LEDs illustrated in FIGS. 14A-14D may be replaced with UV LEDs. In some embodiments, pump LEDs with an emission wavelength less than 500 nm are utilized. In the embodiment illustrated in FIG. 14B, a QD layer 400 (e.g. with red emitting QDs) is formed over a deep blue emitting pump LED 101, while green emitting and blue emitting LEDs 101 are bare (i.e. with no overlying QD layer). In the embodiment illustrated in FIG. 14C, a QD layer 400 (e.g. with red emitting QDs) is formed over a deep blue emitting pump LED 101, a QD layer 400 (e.g. with green emitting QDs) is formed over a deep blue emitting pump LED 101, while a blue emitting LED 101 is bare (i.e. with no QD layer). In the embodiment illustrated in FIG. 14D, a QD layer 400 (e.g. with red emitting QDs) is formed over a deep blue emitting pump LED 101, a QD layer 400 (e.g. with green emitting QDs) is formed over a deep blue emitting pump LED 101, and a QD layer 400 (e.g. with blue emitting QDs) is formed over a deep blue emitting pump LED 101. In the embodiment illustrated in FIG. 14E a QD layer 400 (e.g. with red emitting QDs) is formed over a blue emitting LED 101, while green emitting and blue emitting LEDs 101 are bare (i.e. with no overlapping QD layer). In such an arrangement, only two LED donor wafers are used to form the pixel arrangement.

In the particular embodiments, illustrated in FIGS. 14A-14E, the QD layers 400 are illustrated as dome shaped. For example, this may be accomplished by ink jetting individual QD layers 400 over the LEDs 101. However, embodiments are not limited to the specific shape and arrangement of QD layers 400 illustrated in FIGS. 14A-14E, and the relationships of QD layer peak emission with LED 101 peak emission wavelengths within pixels can be integrated into a number of alternative structures, such as a wavelength conversion cover arrangement, QD patch arrangement, or QD patterning on the display substrate.

In the following description with regard to FIGS. 15-21C various display configurations are described and illustrated in accordance with embodiments for integrating a pump LED with overlying QD layer, and an emissive LED with no overlying QD layer. For example, the integration schemes may be related to a wavelength conversion cover arrangement, QD patch arrangement, or QD patterning on the display substrate. While only two LEDs are described and illustrated, it is to be appreciated that embodiments are not so limited and that the embodiments of FIGS. 15-21C are compatible with other embodiments described herein, including the LED and QD layer various described and illustrated with regard to FIGS. 14A-14E.

Additionally, various configurations are illustrated in FIGS. 15-21C in which a Bragg reflector layer 440 (e.g. to reflect a peak emission wavelength of a quantum dot layer 400) may optionally be included over either or both of a pump LED 101 and emissive LED 101, and a Bragg reflector layer 465 (e.g. to reflect a peak emission wavelength of a pump LED 101) may optionally be included over either or both of a quantum dot layer 400 (e.g. over a pump LED 101) and over a fill material 402, for example (e.g. over an emissive LED 401). It is to be understood that the Bragg reflector layers 440, 465 can be patterned to form openings over one or more LEDs 101 and subpixels. In practice either of the Bragg reflector layers 440, 465 may be patterned to increase performance. For example, in an embodiment the pump LED 101 is a blue emitting LED. In such a configuration, a Bragg reflector layer 465 may be formed over a quantum dot layer 400 (e.g. for red emission, red subpixel) and optionally patterned so that it does not cover (e.g. is not formed over) a blue emissive LED 101 (e.g. blue subpixel). In an embodiment, the pump LED 101 is a UV emitting LED or deep blue emitting LED, and the Bragg reflector layer 465 is formed over all LEDs 401 (pump and emissive) within a pixel, though the Bragg reflector layer 465 may optionally be patterned. These two examples are illustrative of numerous combinations that are envisioned. In interest of not obscuring the present embodiments, the Bragg reflector layers 440, 465 are illustrated in FIGS. 15-21C as being formed over both the exemplary pump LED and emissive LED, however, this is optional and embodiments are not so limited.

Figure 15:
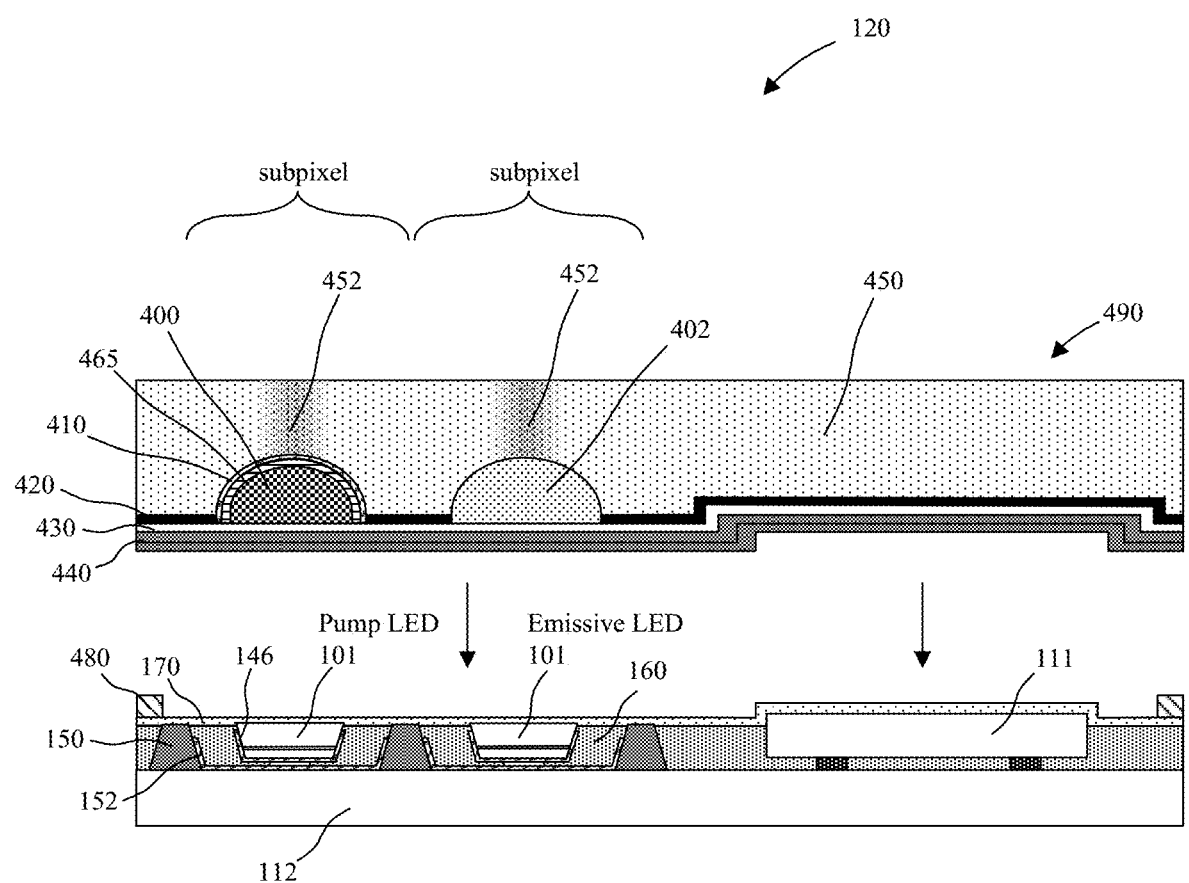
FIG. 15 a schematic cross-sectional side view illustration of a portion of a display panel including a wavelength conversion cover in accordance with an embodiment.
Figure 16A:
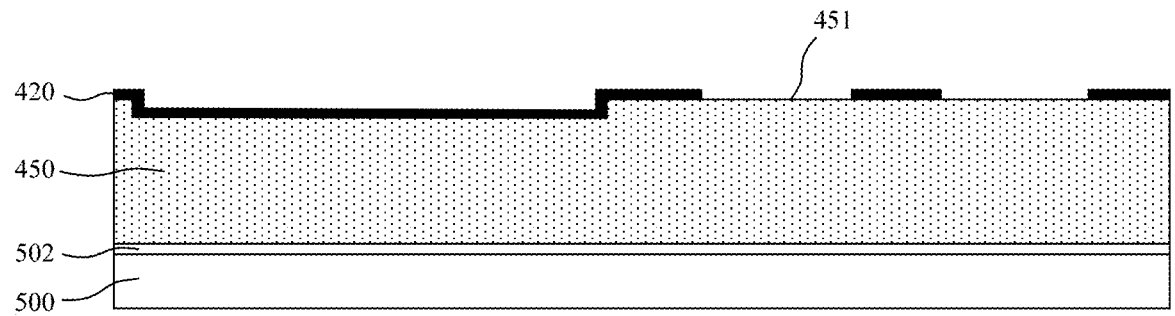
FIGS. 16A-16D are schematic cross-sectional side view illustrations of methods of forming a wavelength conversion cover in accordance with embodiments.
Figure 16B:
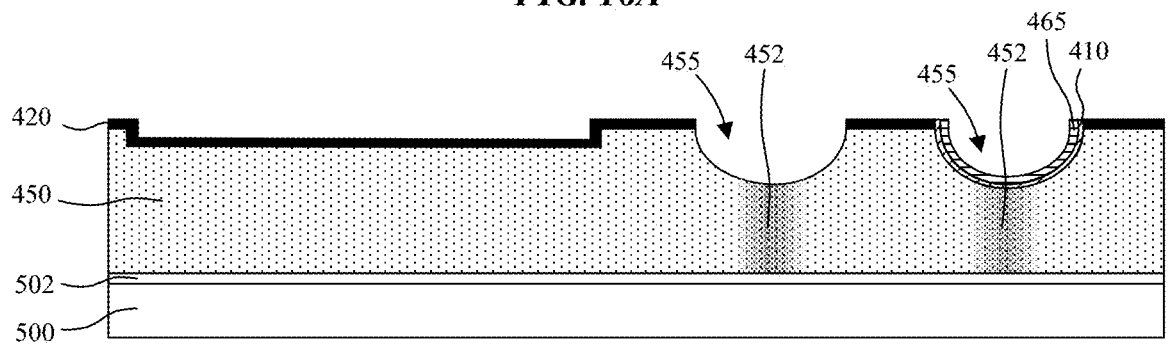
Figure 16C:
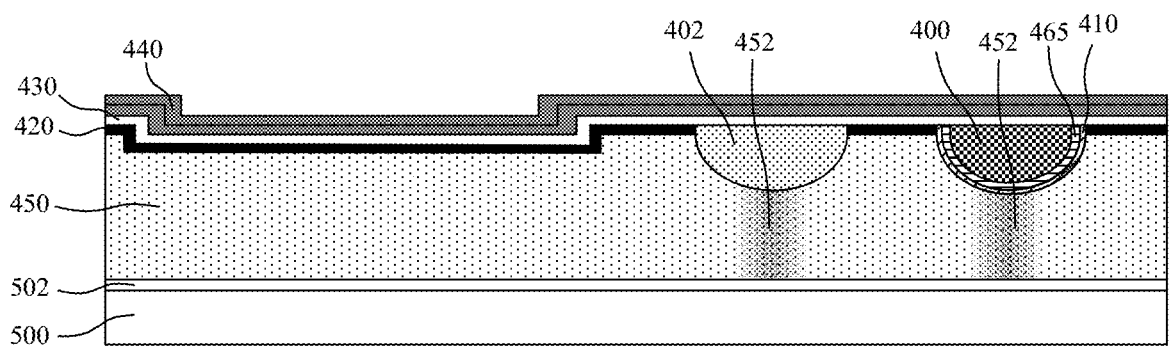
Figure 16D:
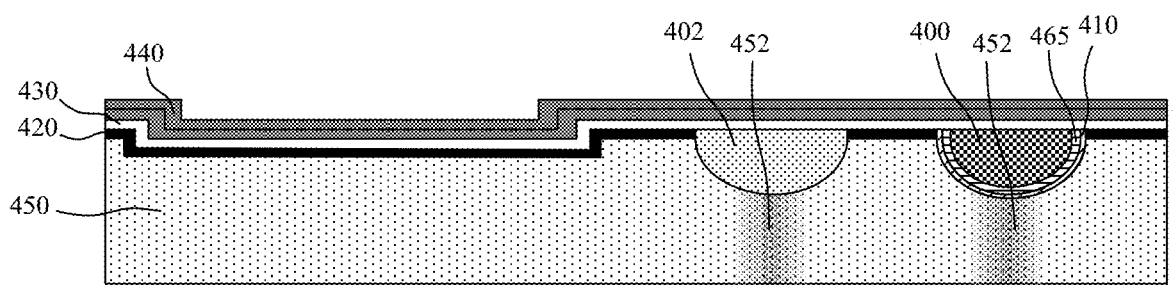

Referring now to FIG. 15 a schematic cross-sectional side view illustration is provided of a portion of a display panel in accordance with an embodiment. The display panel 120 includes a display substrate 112, an array of LEDs 101 mounted on the display substrate 112 in an array of pixels (for example, as described and illustrated with regards to FIGS. 6-8). As shown, bank structures 150 may optionally be formed around the LEDs 101. LEDs 101 may optionally include a reflective mirror 146 for direction of light emission. Bank structures 150 may optionally include a reflective mirror 152 for direction of light emission. As shown, the LEDs 101 are embedded in a passivation layer 160 laterally surrounding sidewalls of the LEDs 101 and above a quantum well layer of the LEDs. A top electrode layer 170 is formed over the array of LEDs 101.

A wavelength conversion cover 490 is transferred to the display substrate 112 so that the array of quantum dot layers 400 are aligned over an array of LEDs 101 mounted on the display substrate. As shown, the wavelength conversion cover 490 includes an array of quantum dot layers 400 embedded in a cover film 450 (e.g. polymer, glass, etc.). In an embodiment, the wavelength conversion cover 490 may be secured over all of the pixels in the display area 114 (see FIG. 7) of the display panel 120. The wavelength conversion cover 490 may be attached to the display substrate 112, and hermetically sealed using seal 480 such as glass frit, epoxy, glass to glass laser seal, etc. or not hermetically sealed using seal 480 such as epoxy, adhesive, etc.

LEDs 101 may be pump LEDs with a QD layer 400 arranged over the LED 101 (as shown in the left subpixel), or emissive LEDs with no QD layer 400 arranged over the LED 101 (as shown with the right subpixel). For example, each QD layer 400 may be contained within a cavity (see 455 FIG. 16B) formed in a bottom surface (see 451 FIG. 16A) of the cover film 450. Where a QD layer 400 is not aligned over an emissive LED 101, a fill material 402 may optionally be formed contained within a cavity aligned over the emissive LED 101. For example, the fill material 402 may include a scattering agent to scatter light emitted from the underlying LED 101 and distribute light emitting from the subpixel similarly as the subpixel including the QD layer 400. In an embodiment, light guides 452 may be formed in the cover film 450 over the cavities. The light guides 452 may be characterized by a higher refractive index than a bulk of the cover film 450 to contain the light. A barrier layer 430, e.g. atomic layer deposition (ALD) $Al_2O_3$ film, may optionally be formed on the cover film 450 to seal the QD layers 400. A Bragg reflector layer 440 (e.g. composed of multiple thin layers of dielectric material), which may also function as a barrier layer 430, may optionally be formed on the cover film 450. The Bragg reflector layer 440 is positioned under the QD layers 400 and aligned over the pump LEDs 101 in the embodiment illustrated. In this manner, the Bragg reflector layer 440 is transparent to the peak emission wavelength of the pump LEDs 101, and reflective to the QD layers 400. Separate Bragg reflector layers 440 may be formed where different QD layers 400 are included. For example, green emitting QD layers 400 and red emitting QD layers 400 may have different corresponding Bragg reflector layers 440.

In the embodiment illustrated, a single Bragg reflector layer 440 may be formed across the subpixel including the QD layer 400 and fill material 402. For example, in such an embodiment, the Bragg reflector layer 440 may be transparent to the peak emission wavelengths for both the pump and emissive LEDs 401. Alternatively, a Bragg reflector layer 440 may not be formed across the fill material 402. In an embodiment utilizing a single pump LED 101 peak emission wavelength, a single Bragg reflector layer 440 may be included over each pump LED 101 within a pixel.

By way of example, and for illustrational purposed the arrangements of LEDs 401 illustrated in FIG. 15 may include a pump LED 101 designed to emit a peak emission wavelength between 340 nm and 420 nm (e.g. between 380 nm and 420 nm), and an emissive LED 101 designed to emit a peak emission wavelength above 438 nm (e.g. blue, green, red, etc.). Quantum dot layer 400 is aligned over the pump LED 101. Quantum dot layer 400 includes quantum dots designed to emit a peak emission wavelength above 438 nm. A color filter layer 410 may optionally be formed in cavity and over the quantum dot layer 400 to absorb the peak emission wavelength of the pump LED 101 (i.e. to mitigate bleeding of the pump LED). In an embodiment, color filter layer 410 is a UV-cut absorber with a cut-off wavelength e.g. at 380 nm or 400 nm to absorb the pump wavelength while being transparent to all visible wavelengths. Fill material 402 may optionally be aligned over the emissive LED 101. In an embodiment, a cavity is not formed in region of the cover film 450 aligned over the emissive LED 101.

In an embodiment, a Bragg reflector layer 465 (e.g. composed of multiple thin layers of dielectric material) may be formed over the quantum dot layer 400, and underneath the color filter layer 410, if present. The Bragg reflector layer 465 may be reflective of the peak emission wavelength of the pump LEDs 101, and transparent to the peak emission wavelength of the QD layers 400. In this manner, the pathlength of the pump LED 101 through the QD layer 400 may be increased, potentially increasing efficiency of the QD layers 400.

A method of forming the wavelength conversion cover 490 is illustrated and described with regard to FIGS. 16A-16D. As shown, a cover film 450 (e.g. glass or polymer substrate) may optionally be attached to a support substrate 500, for example, with an optional adhesive film 502. In a specific embodiment an amorphous hydrogenated silicon film (Si:H) can be formed, for example by plasma enhanced chemical vapor deposition (PECVD) to a thickness, for example of 200 nm. A glass or polymer cover film 450 may then be coated onto the (Si:H) film. Cavities 455 may be formed in what will be the bottom surface 451 of the cover film 450 using a variety of available techniques include lithography and etching, embossing, laser ablation/evaporation, etc. Cavities 455 may additionally be lens shaped to aid light extraction and control light. In the embodiment illustrated, the cavities do not extend all the way through a thickness of the cover film. In such a configuration, the cover film 450 may be formed of a transparent material to allow light transmission through a portion of the bulk material above the cavities 455 in the display panel. A black matrix layer 420 may optionally be formed and patterned on the bottom surface 451 of the cover film 450 before or after forming the cavities 455, for example to decrease ambient light reflection.

Following the formation of cavities 455, a color filter layer 410 and Bragg reflector layer 465 may optionally be formed in and along the walls of one or more cavities 455 in a pixel. In an embodiment, the same Bragg reflector layer 465 may be formed along the walls of multiple cavities 455 corresponding to different subpixels within a pixel. The Bragg reflector layer 465 may be designed to be reflective of the peak emission wavelength of a pump LED, while being transparent to the QD layers 410 and/or emissive LEDs 101. In an embodiment, the same color filter layer 410 is formed along the walls of multiple cavities 455 corresponding to different subpixels within a pixel. The color filter layer 410 may be designed to absorb the peak emission wavelength of a pump LED, while being transparent to the QD layers 410 and/or emissive LEDs 101. In an embodiment, color filter layer 410 is a UV-cut absorber with a cut-off wavelength e.g. at 380 nm or 400 nm to absorb the pump wavelength while being transparent to all visible wavelengths. Accordingly, in a configuration using multiple quantum dot layers 400 for different subpixels, and the same pump LED emission wavelength for those subpixels, may include the same color filter layer 410 and Bragg reflector layer 465 in those respective subpixels. In an embodiment, a color filter layer 410 and Bragg reflector layer 465 are not included in a cavity 455 that will be aligned over an emitting LED, particularly if the peak emission wavelength of the emitting LED is absorbed by the color filter layer 410 or reflected by the Bragg reflector layer 465. In some instances, it may be economical to leave the color filter layer 410 and Bragg reflector layer 465 over an emitting LED where the color filter layer 410 and Bragg reflector layer 465 were designed to interact with a pump LED that has a primary emission wavelength that is different than that for the emitting LED.

Following the formation of cavities 455, and optionally color filter layer(s) 410 and Bragg reflector layer 465, one or more arrays of QD layers 400, and optionally fill material 402, are formed within the cavities 455 in a pixel. Exemplary manners of formation include coating (e.g. slot die, slit coating, screen printing, etc.) and dispensing (e.g. ink-jet printing, micro dispense, etc.). Exemplary arrangements of QD layers 400 within an RGB pixel system are illustrated in FIGS. 14A-14E. In addition to the formation of QD layers 400, fill material 402 may be similarly formed within cavities 455 to be aligned over bare LEDs 101. Following the formation of QD layer(s) 400 and optionally fill material 402, a barrier layer 430 and/or Bragg reflector layer 440 may be formed.

In an embodiment, a laser lift off method is used to release the cover film 450 including the embedded QD layers 400, and optionally embedded fill material 402, from the carrier substrate 500.

Figure 17:
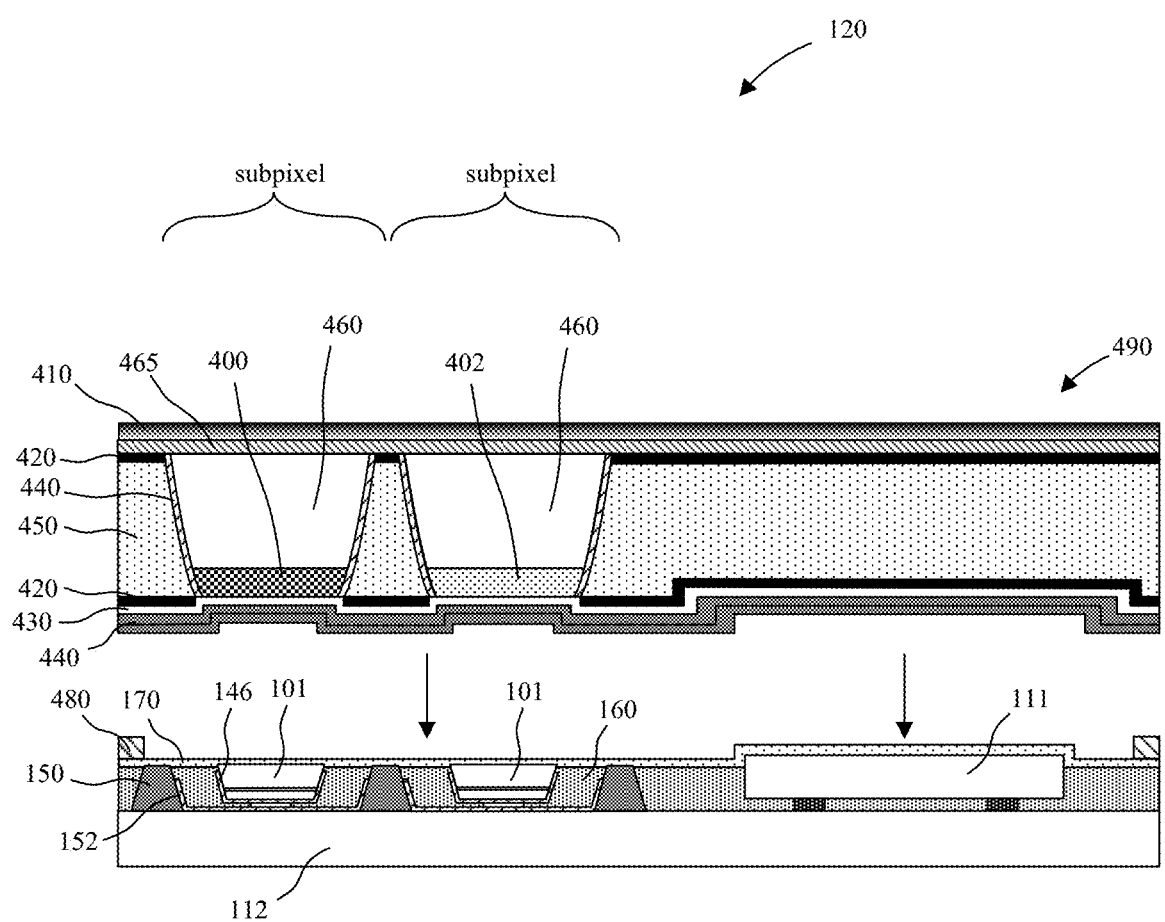
FIG. 17 is a schematic cross-sectional side view illustration of a portion of a display panel including a wavelength conversion cover in accordance with an embodiment.

Referring now to FIG. 17 a schematic cross-sectional side view illustration is provided of a portion of a display panel in accordance with an embodiment. The display panel illustrated in FIG. 17 contains many similarities as the one previously illustrated and described with regard to FIG. 15. The display panel 120 includes a display substrate 112, an array of LEDs 101 mounted on the display substrate 112 in an array of pixels (for example, as described and illustrated with regards to FIGS. 6-8). A wavelength conversion cover 490 is transferred to the display substrate 112 so that the array of quantum dot layers 400 are aligned over an array of LEDs 101 mounted on the display substrate. As shown, the wavelength conversion cover 490 includes an array of quantum dot layers 400 embedded in a cover film 450 (e.g. polymer, glass, etc.). In an embodiment, the wavelength conversion cover 490 may be secured over all of the pixels in the display area 114 (see FIG. 7) of the display panel 120. The wavelength conversion cover 490 may be attached to the display substrate 112, and hermetically sealed using seal 480 such as glass frit, epoxy, glass to glass laser seal, etc. or not hermetically sealed using seal 480 such as epoxy, adhesive, etc. One difference from the embodiment illustrated in FIG. 17 compared to the embodiment illustrated in FIG. 15 is in the design for controlling light emission profile. For example, cavities may optionally be formed completely through the cover film 450. The cavities may additionally optionally be lined with a mirror layer 440 rather than color filter layer. The cavities may additionally optionally be partially filled with a QD layer 400 or fill material 402.

A method of forming the wavelength conversion cover 490 of FIG. 17 is illustrated and described with regard to FIGS. 18A-18D. As shown, a cover film 450 (e.g. glass or polymer substrate) may optionally be attached to a support substrate 500. Cavities 455 are etched into the cover film 450 using a suitable etching technique, such as holographic etching. The shape and profile of the cavities 455 can be changed to control emission profile of the respective sub-pixels. In the embodiment illustrated in FIG. 18A, the cavities 455 are etched completely through the cover film 450. In such a configuration, the cover film 450 may be formed of a transparent material, or optionally opaque material to limit light transmission to the areas defined by cavities 455. A black matrix layer 420 may optionally be formed on the cover film 450 prior to or after etching cavities 455.

Following the formation of cavities 455, a mirror layer 440 may be formed in and along the walls of one or more cavities 455 in a pixel. In an embodiment, the mirror layer 440 is formed within all cavities 455. The mirror layer 440 may be designed to reflect light from QD layers, as well as from emissive LEDs 101 if present. One or more QD layers 400 may be from in cavities 455 that will be aligned over pump LEDs 101. In the embodiment illustrated, a fill material 402 may optionally be formed in the cavities 455 that will be aligned over emissive LEDs 101. Different QD layers 400 may be formed over different subpixels designed for different color emission.

Figure 18A:
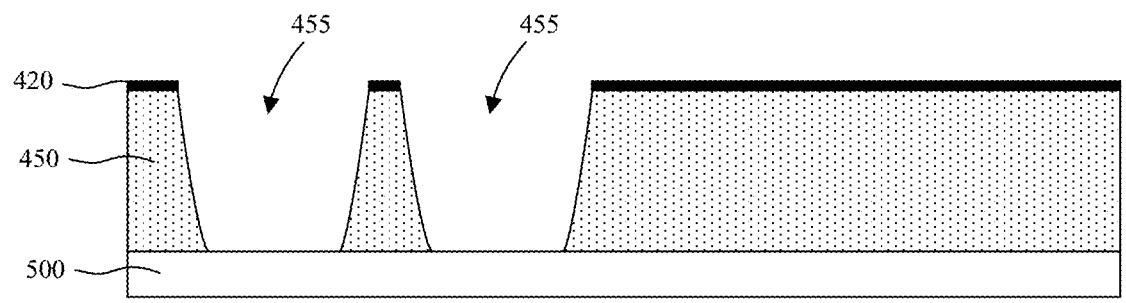
FIGS. 18A-18D are schematic cross-sectional side view illustrations of methods of forming a wavelength conversion cover in accordance with embodiments.
Figure 18B:
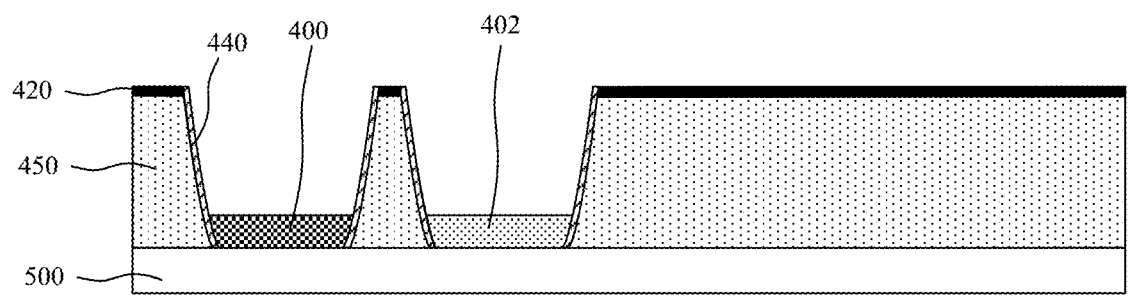
Figure 18C:
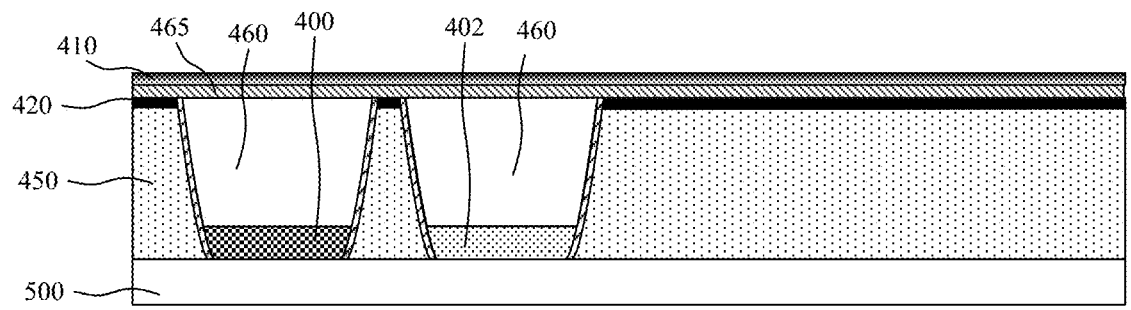

Referring now to FIG. 18C, a secondary fill material 460 may then be formed in any remaining open space within cavities 455. For example, secondary fill material 460 may be characterized by a higher refractive index than cover film 450. The secondary fill material 460 may also function as a leveling material for the formation of additional layers. For example, secondary fill material 460 may have a top surface that is coplanar with a top surface of the black matrix layer 420 or cover film 450. Exemplary manners of forming the QD layers 400, fill material 402, and secondary fill material 460 include coating (e.g. slot die, slit coating, screen printing, etc.) and dispensing (e.g. ink-jet printing, micro dispense, etc.). Exemplary arrangements of QD layers 400 within an RGB pixel system are illustrated in FIGS. 14A-14E. Following the formation of QD layer(s) 400, optional fill material 402, and optional secondary fill material 460, a Bragg reflector layer 465 and a color filter layer 410 may optionally be formed over the available surface. In an embodiment, the Bragg reflector layer 465 is designed to reflect the peak emission wavelength of the pump LEDs, and be transparent to the QD layers 400 and optionally other emissive LEDs. In an embodiment, the color filter layer 410 is designed to absorb the peak emission wavelength of the pump LEDs 101. In an embodiment, color filter layer 410 is a UV-cut absorber with a cut-off wavelength e.g. at 380 nm or 400 nm to absorb the pump wavelength while being transparent to all visible wavelengths.

Figure 18D:
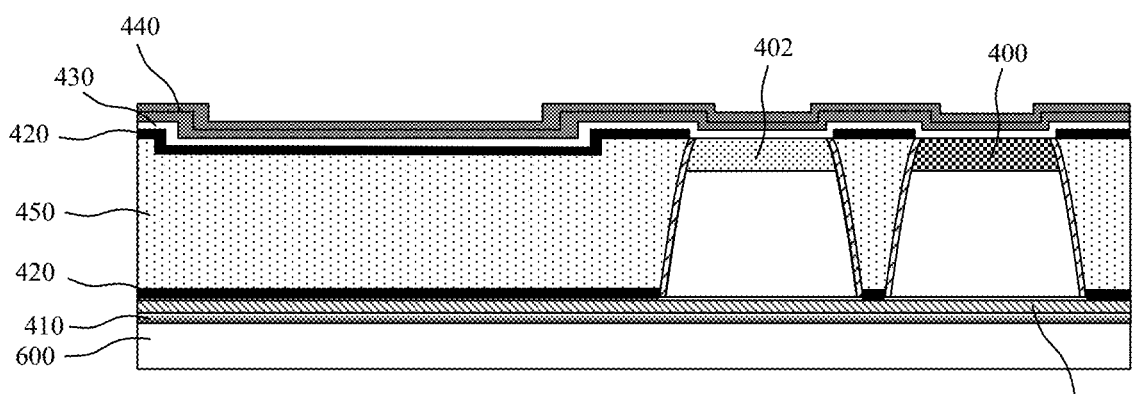

Referring now to FIG. 18D, the carrier substrate 500 is released, and the opposite side of the structure is attached to a second carrier substrate 600. A black matrix layer 420 may optionally be formed over the cover film 450. Alternatively, a black matrix layer 420 could have been formed on the carrier substrate 500 prior to the cover film 450, and cavities 455 patterned through the cover film 450 and black matrix layer 420. In the embodiment illustrated, a barrier layer 430 and/or Bragg reflector layer 440 may optionally be formed. The second carrier substrate 600 may be released, resulting in the wavelength conversion cover 490 illustrated in FIG. 17.

Figure 19A:
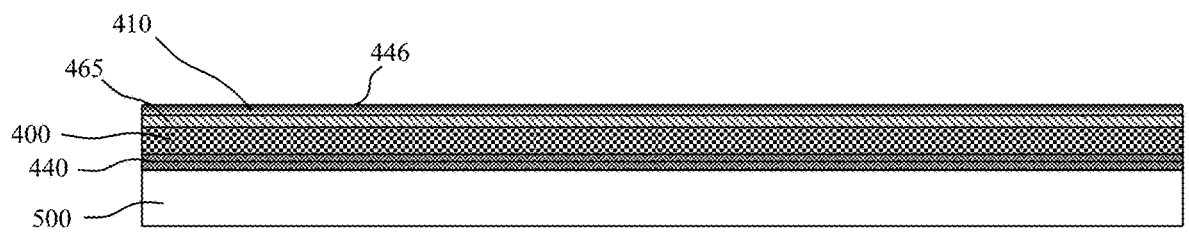
FIGS. 19A-19E are schematic cross-sectional side view illustrations of methods of forming a display panel including quantum dot patches in accordance with embodiments.

Referring now to FIGS. 19A-19E a method of forming a display panel including quantum dot patches 445 is illustrated in accordance with embodiments. Referring to FIG. 19A, a QD layer 400 is formed on a carrier substrate 500. The QD layer 400 may include QDs embedded in a matrix material such as an inorganic (e.g. metal oxide, glass, etc.) or organic (e.g. polymer such as acrylate, epoxy, silicone, etc.). The QD layer 400 may also be formed similarly as previously described with regard to FIGS. 12A-13B. The QD form factor may be any of the QD form factors previously described, such as bare QDs, nano-encapsulate QDs, micro-encapsulated QDs, etc.

The QDs can emit any wavelength of light when pumped with any wavelength of light lower (and higher energy) than the QD band gap. In an embodiment, a Bragg reflector layer 440 (e.g. to reflect the QD emission) is optionally formed on the carrier substrate 500 prior to forming the QD layer 400. In an embodiment, a Bragg reflector layer 465 (to reflect pump LED emission) is optionally formed over the QD layer 400. In an embodiment, a color filter layer 410 (e.g. to absorb the pump LED light) is optionally formed over the QD layer 400. In an embodiment, color filter layer 410 is a UV-cut absorber with a cut-off wavelength e.g. at 380 nm or 400 nm to absorb the pump wavelength while being transparent to all visible wavelengths.

Figure 19B:
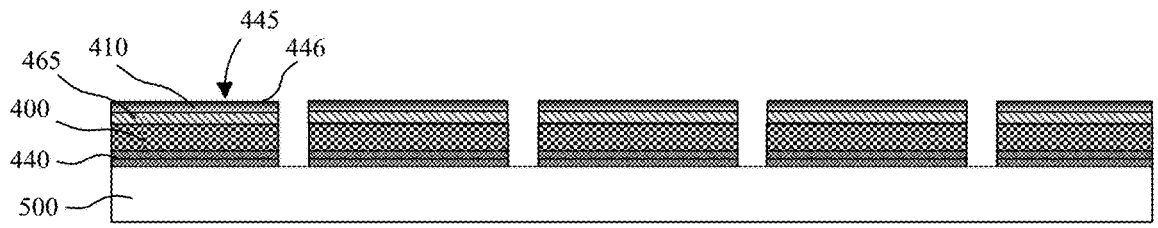

Referring to FIG. 19B the layers formed on the carrier substrate 500 are patterned to form discrete QD patches 445 using a suitable technique such as etching, saw, laser, etc. The discrete QD patches 445 may then be poised for pick up and transfer to a display substrate 112 similarly as the LEDs 101 and optionally microdrivers 111 as previously described. In an embodiment, a method of forming a display panel includes electrostatically transferring an array of LEDs 101 from an LED carrier substrate to a display substrate 112, and electrostatically transferring an array of QD patches 445 from a QD patch carrier substrate 500 to the display substrate 112, and aligning the array of QD patches 445 over the array of LEDs 101. The arrangement of LEDs 101 and QD patches 445 including QD layers 400 may be any of those arrangements previously described with regard to FIGS. 14A-14E, amongst other possible arrangements.

Figure 19C:
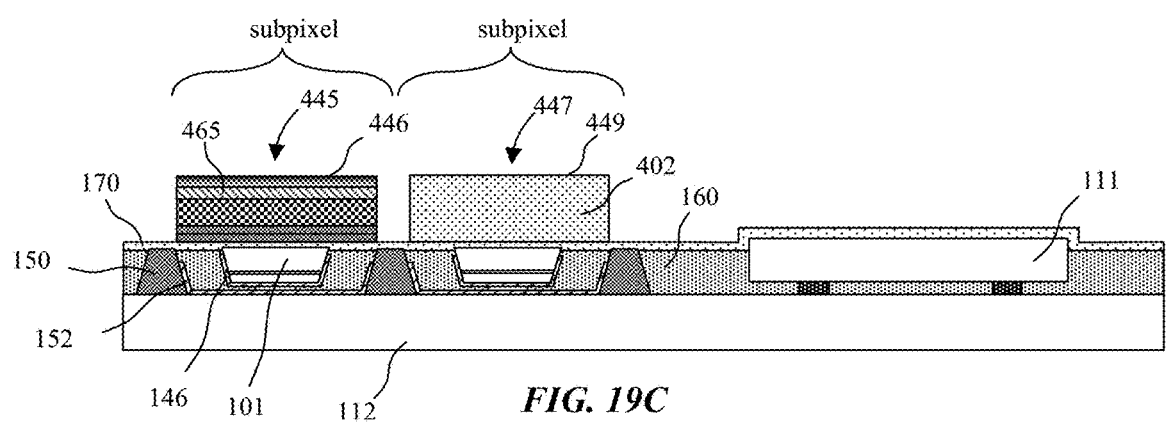

Referring to FIG. 19C, in an embodiment a fill material patch 447 including fill material 402 is transferred to the display substrate, and aligned over emissive LED 101. For example, the fill material 402 may be similar to previously described fill material, and may include scattering particles. In accordance with embodiments, the QD patches 445 and optional fill material patches 447 include planar top surfaces 446, 449, respectively. The planar top surfaces may be useful for electrostatic transfer operations, where a planar top surface facilitates uniform contact with the electrostatic transfer heads and the patches.

Figure 19D:
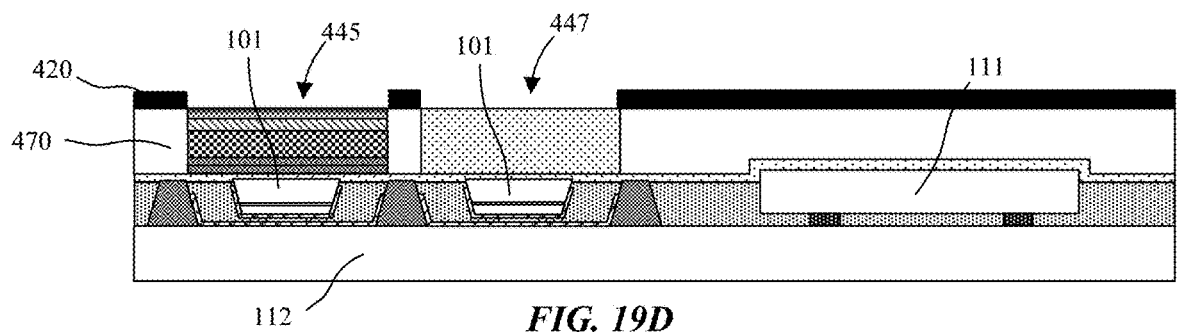

As shown in FIG. 19D, following the transfer of QD patches 445 and optionally fill material patches 447, a planarization layer 470 may optionally be formed around the array of QD patches 445, and optionally fill material patches 447 on the display substrate 112. A black matrix layer 420 may optionally be formed over the planarization layer 470 to reduce ambient light reflection.

Figure 19E:
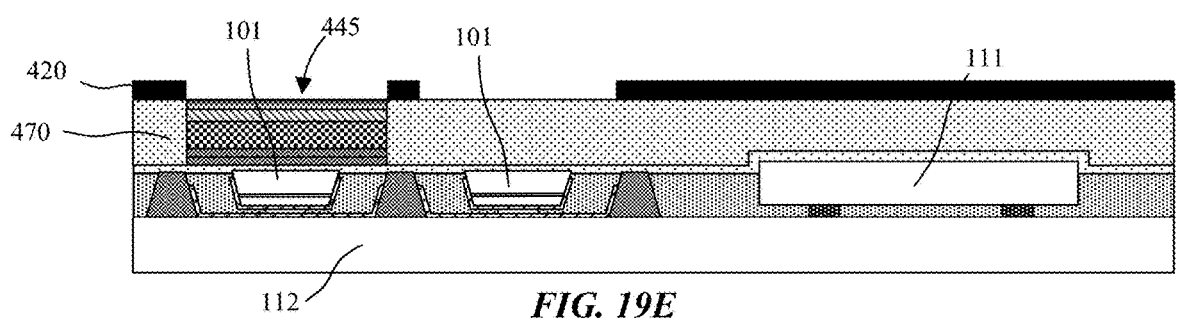

In the embodiment illustrated in FIG. 19E, fill material patches 447 are not aligned over the emissive LEDs 101, and the planarization layer 470 is formed directly over the emissive LEDs 101. In an embodiment, the planarization layer 470 is formed of the fill material 402, and may include scattering particles.

In an embodiment, a display panel includes a display substrate 112, an array of LEDs mounted on the display substrate in an array of pixels, and an array of quantum dot patches 445 aligned over the array of LEDs 101, where each quantum dot patch 445 in the array of quantum dot patches includes a planar top surface 446. The quantum dot patches 445 may include multiple layers, such as a QD layer 400, an optional color filter layer 410 over the QD layer 400, and an optional Bragg reflector layer 440 underneath the QD layer 400. In some embodiments, the array of LEDs 101 are pump LEDs designed to emit a peak emission wavelength between 340 nm and 420 nm (e.g. between 380 nm and 420 nm). A second array of LEDs 101 may be mounted on the display substrate 112 within the array of pixels. As shown in FIGS. 19D and 19E, the second array of LEDs 101 may be emissive LEDs and may be designed to emit a peak emission wavelength above 438 nm. In such a configuration, a QD patch 445 is not aligned over the second array of LEDs. In an embodiment, a second array of QD patches 445 is aligned over the second array of LEDs 101. For example, the second array of QD patches 445 may be designed to emit a different primary wavelength than the first array of QD patches 445. In an embodiment the second array of LEDs are pump LEDs 101 designed to emit a peak emission wavelength between 340 nm and 420 nm (e.g. 380 nm and 420 nm).

In the embodiments illustrated in FIGS. 19A-19E, the QD patches 445 were illustrated as including Bragg reflector layers 440, 465 and color filter 410. However, this is exemplary, and these layers may be included in the structure outside of the QD patches 445. For example, the Bragg reflector layer 440 may be formed over the LEDs 101 prior to transferring the QD patches 445. Additionally, Bragg reflector layer 440 and color filter 410 may be formed after the planarization layer 470. For example, these layers may also be formed over the planarization layer 470.

Figure 19F:
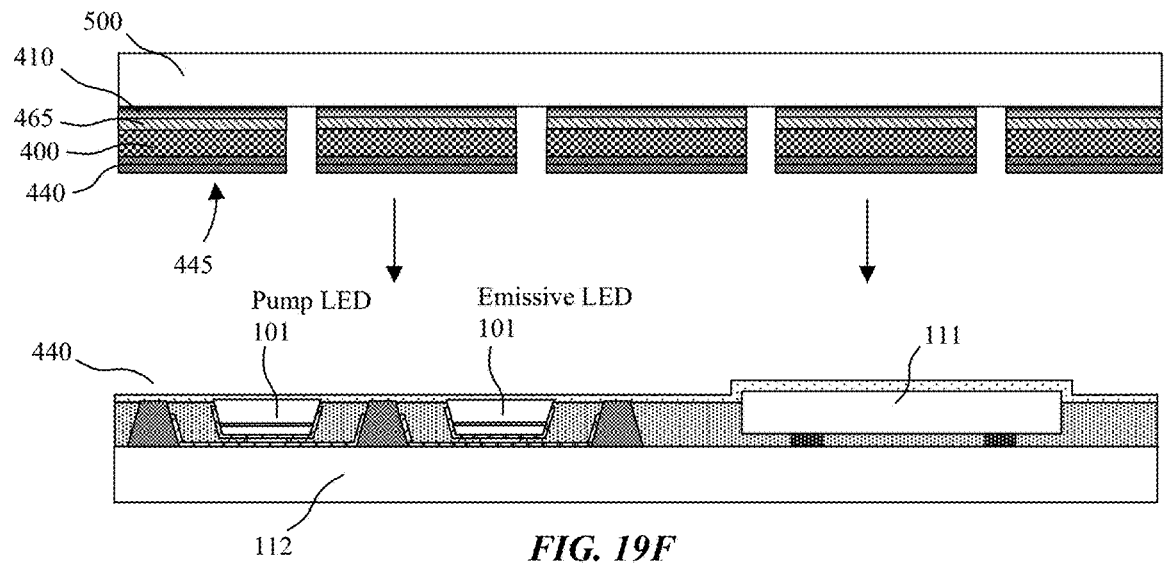
FIGS. 19F-19G are schematic cross-sectional side view illustrations of methods of forming a display panel including layer transfer in accordance with embodiments.
Figure 19G:
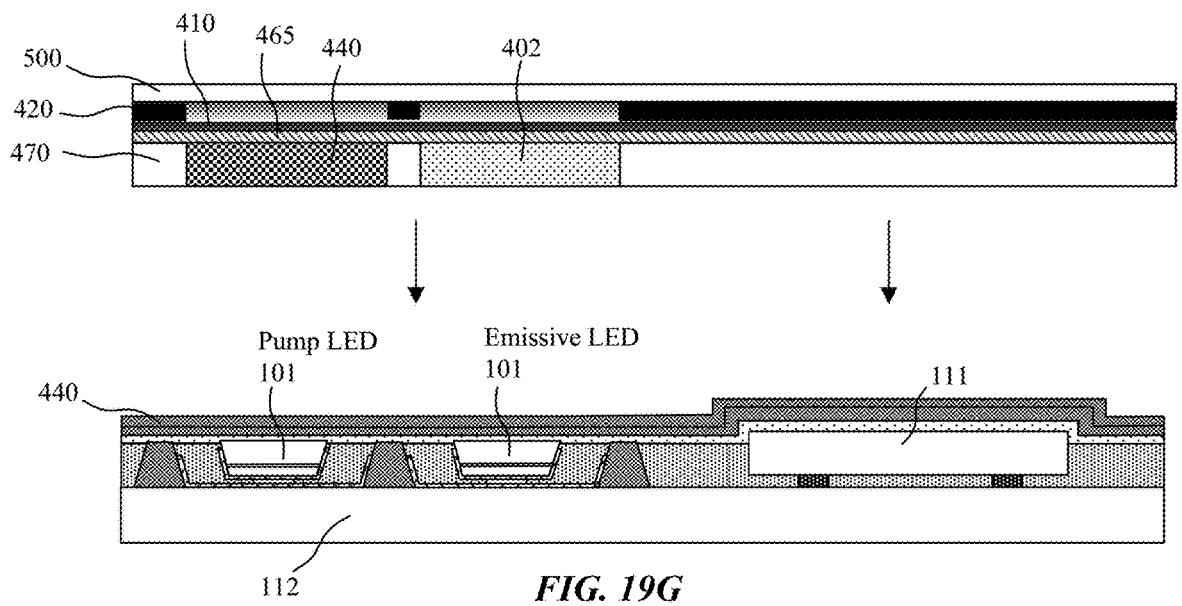

FIGS. 19F-19G are schematic cross-sectional side view illustrations of methods of forming a display panel including layer transfer in accordance with embodiments. In an embodiment illustrated in FIG. 19F, rather than transferring QD patches 445 individually, they may be transferred together in a layer transfer process, similar to wafer bonding. As described in the above paragraph, optional layers such as Bragg reflector layers 440, 465 and color filter may be included in each QD patch, or alternatively formed as a layer to be transferred, as illustrated in FIG. 19G.

Figure 20A:
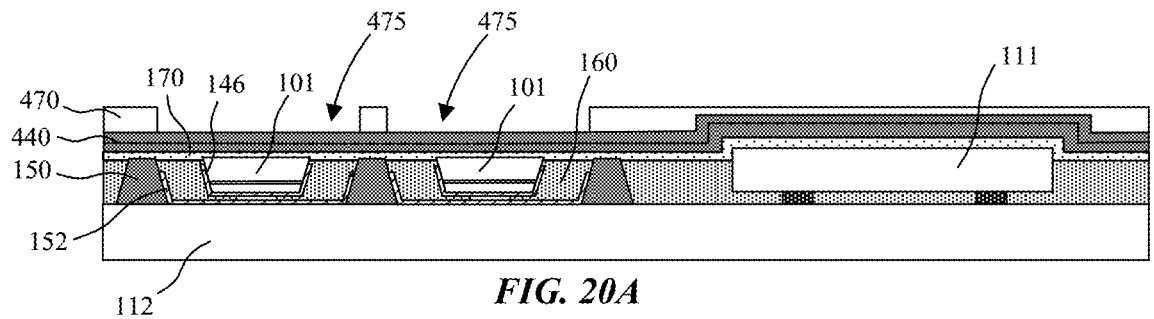
FIGS. 20A-20E are schematic cross-sectional side view illustrations of methods of forming a display panel including quantum dot layers within openings in a planarization layer in accordance with embodiments.
Figure 20B:
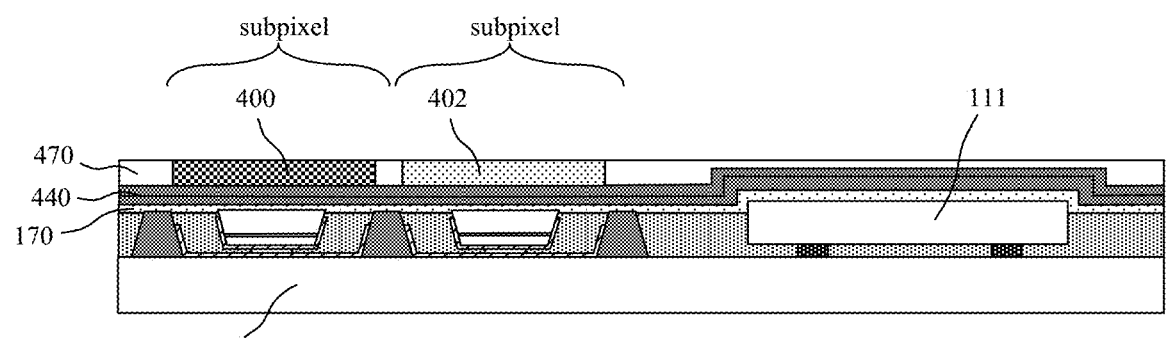
Figure 20C:
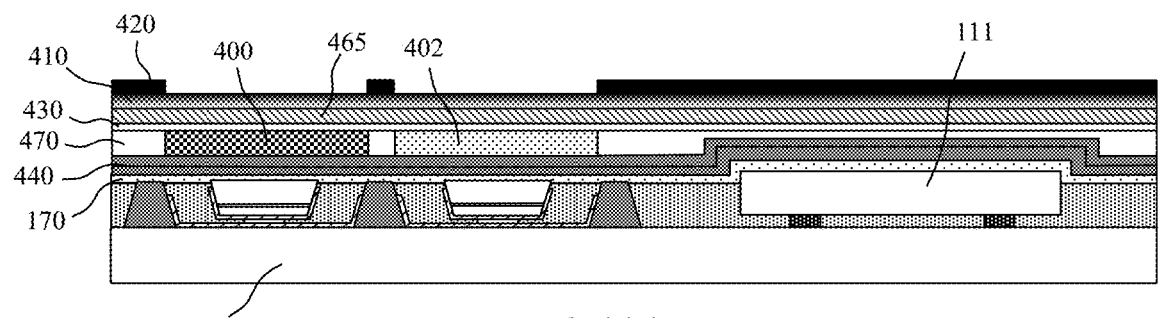

Referring now to FIGS. 20A-20E, methods of patterning QD layers 400 on the display substrate 112 are illustrated in accordance with embodiments. Referring to FIG. 20A, a display substrate 112 with mounted LEDs 101 and microdrivers 111 is illustrated after the formation of top electrode layer 170. A Bragg reflector layer 440 is optionally formed over the top electrode layer 170. Bragg reflector layer 440 may be formed of non-electrically conductive materials, and may additionally electrically passivate the top electrode layer 170 from any overlying electrically conductive layers.

QD layers 400 may then be formed over the pump LEDs 101 and the optional Bragg reflect layers 440. In one embodiment illustrated in FIGS. 20A-20B, the planarization layer 470 is applied over the display substrate, and patterned to form openings 475 over the pump LEDs 101. The QD layers 400 may then be applied within the defined openings. Fill material 402 layers may optionally be similarly formed over the emitting LEDs 101. In one embodiment illustrated in FIGS. 20F-20H, the QD layers 400 are formed over the pump LEDs 101 followed by application of a planarization layer 470. For example, a global QD film can be formed over the substrate, followed by etching away portions of the QD film to achieve QD layers 400 aligned over the pump LEDs 101. In an embodiment, the global QD film is a photodefinable resist material (e.g. positive or negative) that is patterned to form QD layers 400. Fill material 402 layers may optionally be similarly formed over the emitting LEDs 101.

Following the formation of QD layers 400, and optionally fill material 402 layers and planarization layer 470 one or more Bragg reflector layers 465, color filter layers 410 and/or a black matrix layer 420 may optionally be formed. A barrier layer 430 (e.g. ALD $Al_2O_3$ film) may optionally be formed prior to the Bragg reflector layer 465, color filter 410 and/or black matrix layer 420. In the embodiment illustrated, the same Bragg reflector layer 465 and the same color filter layer 410 span over the subpixel including a pump LED 101 as well as a subpixel including an emissive LED 101. In such an embodiment, the Bragg reflector layer 465 is designed to reflect the peak emission wavelength of the pump LED 101 and the color filter layer 470 is designed to absorb the peak emission wavelength of the pump LED 101. In another embodiment, the Bragg reflector layer 465 and/or the color filter layer 410 do not span over the emissive LED 101.

Figure 20D:
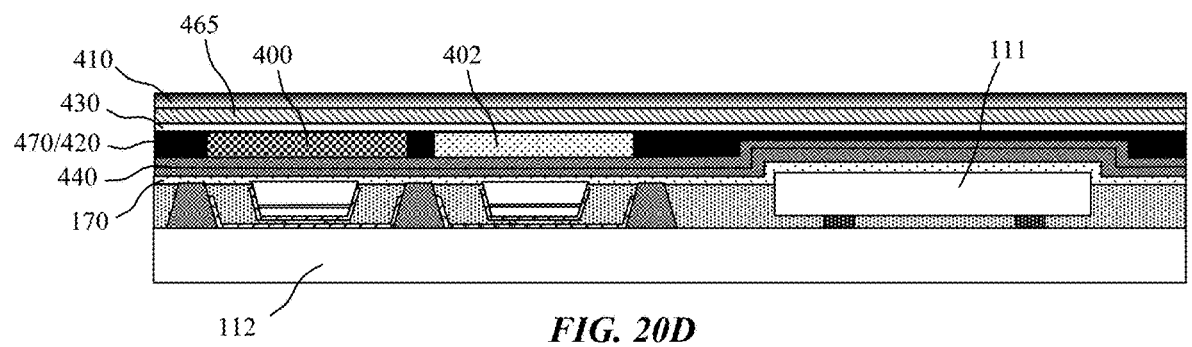

Referring now to FIG. 20D, in an embodiment the planarization layer 470 may also be an opaque material, or black matrix material. In an embodiment, an insulating layer such as a Bragg reflector layer 440 may be formed between the planarization layer 470 and top conductive contact layer 170 to prevent electrical shorting of the top conductive contact layer 170 through conductive particles (e.g. for black matrix) in the planarization layer 470.

Figure 20E:
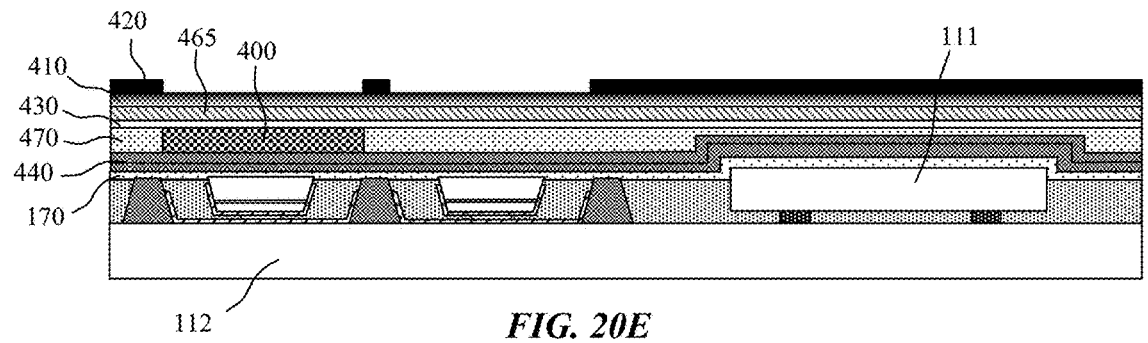
Figure 20F:
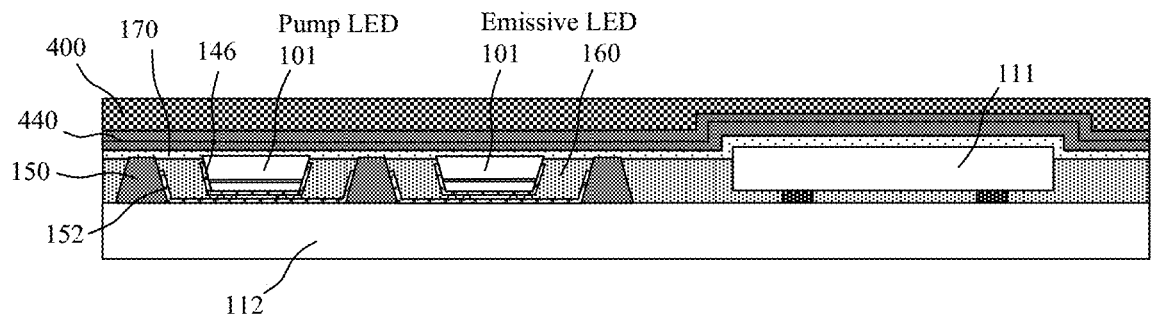
FIGS. 20F-20H are schematic cross-sectional side view illustrations of methods of forming a display panel including patterning photodefinable quantum dot layers in accordance with embodiments.
Figure 20G:
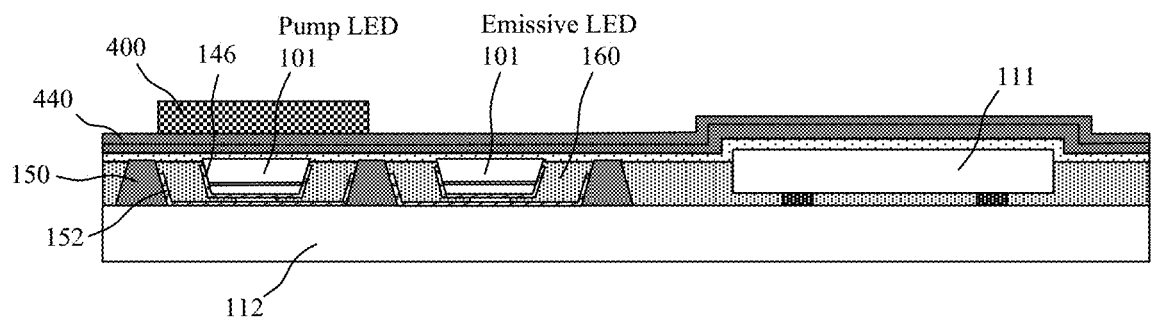
Figure 20H:
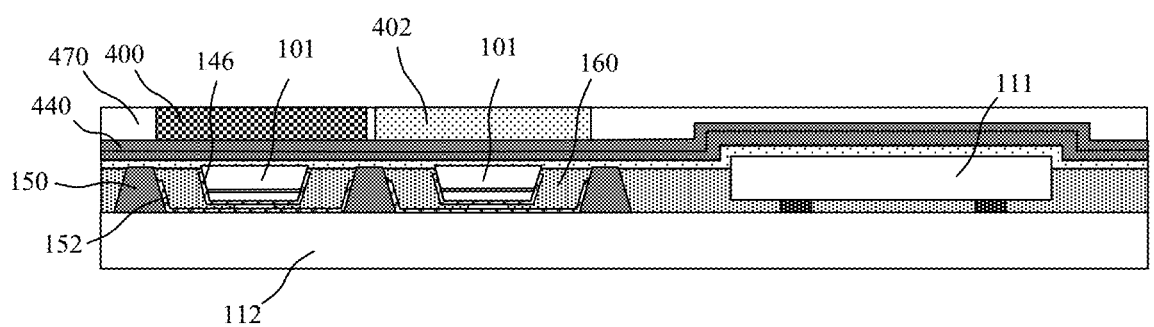

Referring now to FIG. 20E, rather that forming discrete fill material 402 layers over the emissive LEDs 101, in an embodiment the planarization layer 470 may also be formed of the fill material 402, and may include scattering particles.

In an embodiment, a display panel 120 includes an arrangement of LEDs 101 mounted on a display substrate 112 such as that illustrated in FIGS. 20A-20H, and in an array of pixels. A planarization layer 470 is over the array of LEDs 101, and the planarization layer includes an array of openings 475 aligned over the array of LEDs 101. An array of QD layers 400 is within the array of openings 475 aligned over the array of LEDs 101. A top surface of each QD layer 400 in the array of QD layers may be level with a top surface of the planarization layer 470 (e.g. they may have been planarized). A Bragg reflector layer 440 may be formed over the array of LEDs 101 and underneath the planarization layer 470 and the array of QD layers 400. A Bragg reflector layer 465 may be formed over the array of QD layers 400 and the planarization layer 470.

Figure 21A:
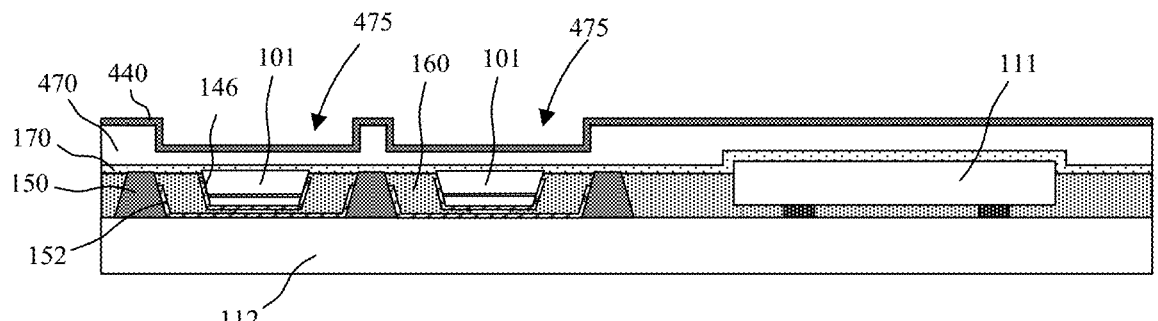
FIGS. 21A-21C are schematic cross-sectional side view illustrations of methods of forming a display panel including quantum dot layers within openings in a planarization layer in accordance with embodiments.
Figure 21B:
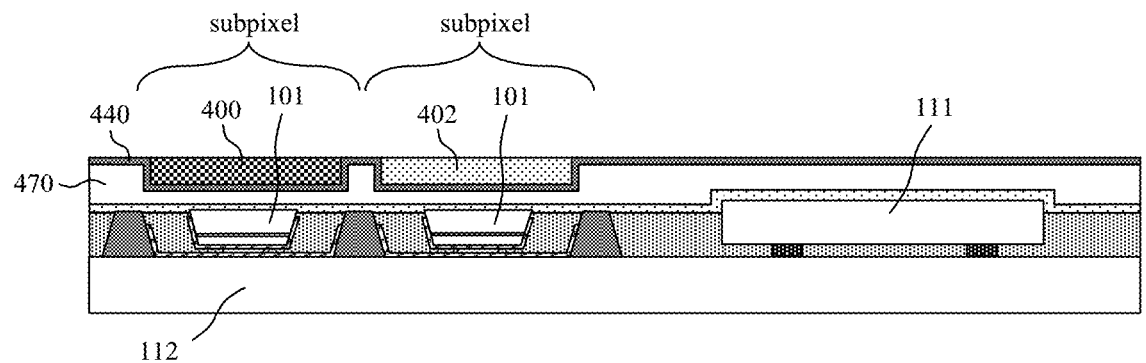
Figure 21C:
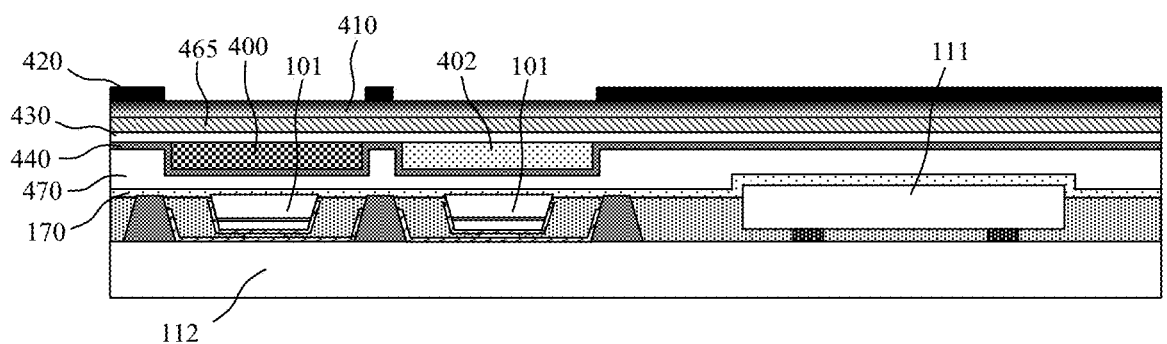

FIGS. 21A-21C illustrate a method of patterning QD layers 400 on the display substrate 112 in accordance with an embodiment. Referring to FIG. 21A, a display substrate 112 with mounted LEDs 101 and microdrivers 111 is illustrated after the formation of top electrode layer 170. A planarization layer 470 is then formed on the display substrate 112 over the array of LEDs 101, top electrode layer 170, and optionally microdrivers 111. In the particular embodiment illustrated, the planarization layer is formed of a transparent material. The planarization layer is patterned to form openings 475 over the pump LEDs 101, and optionally emissive LEDs 101. As shown, the openings 475 may not extend through an entire thickness of the planarization layer 470. A Bragg reflector layer 440 is optionally formed over the planarization layer 170 and within the openings 475.

Referring to FIG. 21B, QD layers 400 may then be formed within the openings 475 over the pump LEDs 101 and the optional Bragg reflect layers 440. Fill material 402 may optionally be similarly formed within the openings 475 over the emitting LEDs 101. Following application of the QD layers 400 and optional fill material 402, the stack structure may be planarized. For example, this may result in a planar top surface including a planar top surface of the QD layers 400, optional fill material 402, and the planarization layer 470 and/or Bragg reflector layer 440. As previously described, one or more Bragg reflector layers 465, color filter layers 410 and/or a black matrix layer 420 may optionally be formed as illustrated in FIG. 21C. A barrier layer 430 (e.g. ALD $Al_2O_3$ film) may optionally be formed prior to the Bragg reflector layer 465, color filter 410 and/or black matrix layer 420.

In an embodiment, a display panel 120 includes an arrangement of LEDs 101 mounted on a display substrate 112 such as that illustrated in FIGS. 21A-21C, and in an array of pixels. A planarization layer 470 is over the array of LEDs 101, and the planarization layer includes an array of openings 475 aligned over the array of LEDs 101. An array of QD layers 400 is within the array of openings 475 aligned over the array of LEDs 101. A top surface of each QD layer 400 in the array of QD layers may be level with a top surface of the planarization layer 470 (e.g. they may have been planarized). A Bragg reflector layer 440 may be formed over the planarization layer 470, where the array of QD layers 400 is over the Bragg reflector layer 440. A top surface of each QD layer 400 in the array of QD layers may be level with a top surface of the Bragg reflector layer 440 (e.g. they may have been planarized). A Bragg reflector layer 465 and color filter layer 410 may be formed over the array of QD layers 400 and the planarization layer 470.

A display system in accordance with embodiments may include a receiver to receive display data from outside of the display system. The receiver may be configured to receive data wirelessly, by a wire connection, by an optical interconnect, or any other connection. The receiver may receive display data from a processor via an interface controller. In one embodiment, the processor may be a graphics processing unit (GPU), a general-purpose processor having a GPU located therein, and/or a general-purpose processor with graphics processing capabilities. The display data may be generated in real time by a processor executing one or more instructions in a software program, or retrieved from a system memory. A display system may have any refresh rate, e.g., 50 Hz, 60 Hz, 100 Hz, 120 Hz, 200 Hz, or 240 Hz.

Depending on its applications, a display system may include other components. These other components include, but are not limited to, memory, a touch-screen controller, and a battery. In various implementations, the display system may be a television, tablet, phone, laptop, computer monitor, automotive heads-up display, automotive navigation display, kiosk, digital camera, handheld game console, media display, ebook display, or large area signage display.

In utilizing the various aspects of the embodiments, it would become apparent to one skilled in the art that combinations or variations of the above embodiments are possible for forming a display panel and system with quantum dots integrated into the display area. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A light emitting structure comprising:
 a reflective bank structure;
 a light emitting diode (LED) mounted within the reflective bank structure;
 a passivation layer laterally surrounding the LED within the reflective bank structure;
 a top electrode layer spanning over the LED, the passivation layer, and the reflective bank structure;
 a film over the top electrode layer;
 a cavity within the film, the cavity directly over the LED;
 a fill material within the cavity.

2. The light emitting structure of claim 1, wherein the cavity is formed completely through a thickness of the film.

3. The light emitting structure of claim 2, further comprising a mirror layer covering sidewalls of the cavity.

4. The light emitting structure of claim 2, wherein the fill material is a higher index material than the film.

5. The light emitting structure of claim 2, wherein the reflective bank structure includes a reflective mirror that spans around and underneath the LED.

6. The light emitting structure of claim 2, wherein the LED comprises an inorganic semiconductor-based p-n diode, and a metallic bottom contact.

7. The light emitting structure of claim 6, wherein the LED has a maximum width of less than 10 microns.

8. The light emitting structure of claim 2, further comprising a color filter layer spanning over the film and cavity.

9. The light emitting structure of claim 2, wherein a top surface of the fill material and a top surface of the film are coplanar.

10. The light emitting structure of claim 2, further comprising a black matrix layer one a top or bottom surface of the film.

11. The light emitting structure of claim 2, further comprising:
 a second reflective bank structure;
 a second LED mounted within the second reflective bank structure;
 a second passivation layer laterally surrounding the second LED within the second reflective bank structure;
 wherein the top electrode layer spans over the second LED, the second passivation layer, and the second reflective bank structure;
 a second cavity within the film, the second cavity directly over the second LED;
 a second fill material within the second cavity.

12. The light emitting structure of claim 11, wherein the second cavity is formed completely through the thickness of the film.

13. The light emitting structure of claim 12, further comprising a second mirror layer covering sidewalls of the second cavity.

14. The light emitting structure of claim 12, wherein the second fill material is a higher index material than the film.

15. The light emitting structure of claim 12, wherein the second reflective bank structure includes a second reflective mirror that spans around and underneath the second LED.

16. The light emitting structure of claim 12, wherein the second LED comprises a second inorganic semiconductor-based p-n diode, and a second metallic bottom contact.

17. The light emitting structure of claim 16, wherein the second LED has a maximum width of less than 10 microns.

18. The light emitting structure of claim 12, further comprising a color filter layer that spans over second cavity.

19. The light emitting structure of claim 12, wherein a top surface of the second fill material and the top surface of the film are coplanar.

20. The light emitting structure of claim 12, wherein the LED and the second LED are designed for different color emissions.

* * * * *